US010444642B2

(12) United States Patent
Shirato

(10) Patent No.: US 10,444,642 B2
(45) Date of Patent: Oct. 15, 2019

(54) MOVABLE BODY APPARATUS, EXPOSURE APPARATUS, MANUFACTURING METHOD OF FLAT PANEL DISPLAY, DEVICE MANUFACTURING METHOD, AND MOVABLE BODY DRIVE METHOD

(71) Applicant: NIKON CORPORATION, Tokyo (JP)

(72) Inventor: Akinori Shirato, Sagamihara (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/031,346

(22) Filed: Jul. 10, 2018

(65) Prior Publication Data

US 2018/0321601 A1 Nov. 8, 2018

Related U.S. Application Data

(62) Division of application No. 15/129,426, filed as application No. PCT/JP2015/059871 on Mar. 30, 2015, now Pat. No. 10,048,600.

(30) Foreign Application Priority Data

Mar. 28, 2014 (JP) .................................. 2014-067435

(51) Int. Cl.
    *G03F 7/20* (2006.01)
    *G02F 1/13* (2006.01)
    *G03F 7/00* (2006.01)
    *G03F 9/00* (2006.01)

(52) U.S. Cl.
    CPC ........ *G03F 7/70775* (2013.01); *G02F 1/1303* (2013.01); *G03F 7/0005* (2013.01); *G03F 7/20* (2013.01); *G03F 7/70716* (2013.01); *G03F 7/70725* (2013.01); *G03F 9/7049* (2013.01)

(58) Field of Classification Search
None
See application file for complete search history.

(56) References Cited

U.S. PATENT DOCUMENTS

| | | |
|---|---|---|
| 5,729,331 A | 3/1998 | Tanaka et al. |
| 6,552,775 B1 | 4/2003 | Yanagihara et al. |
| 6,639,686 B1 | 10/2003 | Ohara |

(Continued)

OTHER PUBLICATIONS

Jun. 23, 2015 International Search Report issued in International Patent Application No. PCT/JP2015/059871.

(Continued)

*Primary Examiner* — Michelle M Iacoletti
(74) *Attorney, Agent, or Firm* — Oliff PLC

(57) ABSTRACT

A substrate stage apparatus provided with: a substrate holder that can be moved in a plane including an X-axis and a Y-axis; a head unit that can be moved synchronously with the substrate holder along the Y-axis; an encoder system for measuring substrate position, the system including a scale disposed on the substrate holder, and heads disposed on the head unit, and acquiring the X-axis direction and the Y-axis direction position information of the substrate holder on the basis of the output of the heads; an encoder system for measuring head-unit position, the system acquiring the Y-axis direction position information of the head unit; and a position control system that controls the position of the substrate holder within the XY plane on the basis of the output of the encoder system for measuring substrate position and the encoder system for measuring head-unit position.

8 Claims, 18 Drawing Sheets

(56) References Cited

U.S. PATENT DOCUMENTS

| | | |
|---|---|---|
| 6,761,482 B2 | 7/2004 | Ueno |
| 7,561,280 B2 | 7/2009 | Schluchter et al. |
| 2008/0030702 A1 | 2/2008 | Kawamura |
| 2008/0094592 A1 | 4/2008 | Shibazaki |
| 2008/0129762 A1 | 6/2008 | Shiomi |
| 2010/0018950 A1 | 1/2010 | Aoki et al. |
| 2010/0073652 A1 | 3/2010 | Shibazaki |
| 2012/0057140 A1 | 3/2012 | Aoki |

OTHER PUBLICATIONS

Oct. 4, 2016 International Preliminary Report on Patentability issued in International Patent Application No. PCT/JP2015/059871.
Sep. 14, 2017 Office Action issued in U.S. Appl. No. 15/129,426.
Apr. 12, 2018 Notice of Allowance issued in U.S. Appl. No. 15/129,426.

MOVABLE BODY APPARATUS, EXPOSURE APPARATUS, MANUFACTURING METHOD OF FLAT PANEL DISPLAY, DEVICE MANUFACTURING METHOD, AND MOVABLE BODY DRIVE METHOD

CROSS REFERENCE TO RELATED APPLICATION

This application is a divisional application of U.S. application Ser. No. 15/129,426, filed Nov. 14, 2016, pending, the disclosure of which is hereby incorporated by reference herein in its entirety.

TECHNICAL FIELD

The present invention relates to movable body apparatus, exposure apparatus, manufacturing methods of flat panel displays, device manufacturing methods, and movable body drive methods, and more particularly to a movable body apparatus and a movable body drive method in which a movable body is driven along a predetermined two-dimensional plane, an exposure apparatus provided with the movable body apparatus, a manufacturing method of flat panel displays using the exposure apparatus, and a device manufacturing method using the exposure apparatus.

BACKGROUND ART

Conventionally, in a lithography process for producing electronic devices (microdevices) such as liquid crystal display devices and semiconductor devices (integrated circuits), apparatus are used such as an exposure apparatus of a step-and-scan method (a so-called scanning stepper (also called a scanner)), which transfers a pattern formed on a mask on a substrate using an energy beam while a mask (photomask) or a reticle (hereinafter referred to collectively as a "mask") and a glass plate or a wafer (hereinafter referred to collectively as a "substrate") are synchronously moved along a predetermined scanning direction (scan direction).

As this kind of exposure apparatus, an exposure apparatus is known with an optical interferometer system that acquires position information within a horizontal plane of a substrate subject to exposure, using a bar mirror (a long mirror) that a substrate stage apparatus has (for example, refer to PTL 1).

When position information of the substrate is acquired using the optical interferometer system, influence of the so-called air fluctuation cannot be ignored. Also, although the influence of the above air fluctuation can be reduced using an encoder system, the increasing size of the substrate in recent years makes it difficult to prepare a scale that can cover the entire moving range of the substrate.

CITATION LIST

Patent Literature

[PTL 1] U.S. Patent Application Publication No. 2010/0018950

SUMMARY OF THE INVENTION

Solution to Problem

The present invention was made under the circumstances described above, and from a first aspect, there is provided a movable body apparatus, comprising: a first movable body movable along a predetermined two-dimensional plane which includes a first direction and a second direction orthogonal to each other; a second movable body movable synchronously with the first movable body along the first direction; a first measurement system, including a first encoder system that has one of a scale and a head disposed at the first movable body and the other of the scale and the head disposed at the second movable body, that acquires position information of the first movable body at least in the second direction on the basis of output of the head; a second measurement system that acquires position information of the second movable body in the first direction; and a position control system that performs position control of the first movable body within the two-dimensional plane, on the basis of output of the first measurement system and the second measurement system.

In the description, "move synchronously with" means that the first and second mobile bodies move in a state roughly maintaining a relative position relation, and that it is not limited to a case in which the first and second movable bodies move in a state where their positions (moving direction and velocity) match exactly.

According to this apparatus, position information of the first movable body in the second direction is acquired by the first encoder system. Since the second movable body moves in the first direction synchronously with the first movable body, the first encoder system can acquire the position information of the first movable body in the second direction, regardless of the position of the first movable body in the first direction. Also, the position information of the first movable body in the first direction can be acquired, on the basis of the output of the second measurement system. As described, the first encoder system only has to cover the movement range of the first movable body in the second direction, which is efficient.

From a second aspect of the present invention, there is provided an exposure apparatus, comprising: the movable body apparatus according to the first aspect of the present invention in which a predetermined object is held by the first movable body; and a pattern formation apparatus, while driving a pattern holding body which holds a predetermined pattern in the second direction synchronously with the first movable body, forms the pattern on the object via the pattern holding body using an energy beam.

From a third aspect of the present invention, there is provided a manufacturing method of a flat panel display, comprising: exposing the object using the exposure apparatus according to the second aspect of the present invention; and developing the object which has been exposed.

From a fourth aspect of the present invention, there is provided a device manufacturing method, comprising: exposing the object using the exposure apparatus according to the second aspect of the present invention; and developing the object which has been exposed.

From a fifth aspect of the present invention, there is provided a movable body drive method in which a movable body is driven along a predetermined two-dimensional plane that includes a first direction and a second direction orthogonal to each other, comprising: driving a first movable body in the second direction, on the basis of an output of an encoder system that has a head disposed at one of the first movable body and a second movable body placed facing the first movable body, and a scale disposed at the other of the first movable body and the second movable body; driving the first movable body in the first direction; driving the second movable body in the first direction synchronously with the first movable body when the first movable body moves in the first direction; and performing position control of the first movable body in the two-dimensional plane, on the basis of position information of the first movable body in the second direction acquired from the output of the encoder system and position information of the second movable body in the first direction.

From a sixth aspect of the present invention, there is provided a movable body apparatus, comprising: a first movable body movable in a first direction; a second movable body movable in a second direction intersecting the first direction, disposed facing the first movable body; a driving system that drives the second movable body in the second direction, corresponding to movement of the first movable body in the second direction; a first measurement system, including a first encoder system that has one of a head which emits a measurement beam and a scale where the measurement beam is irradiated disposed at the first movable body and the other of the head and the scale disposed at the second movable body, that acquires relative position information between the first movable body and the second movable body, on the basis of output of the head receiving the measurement beam via the scale; a second measurement system that acquires position information of the second movable body, different from the relative position information; and a position control system that performs position control of the first movable body, on the basis of output of the first measurement system and the second measurement system.

BRIEF DESCRIPTION OF DRAWINGS

FIG. 2 A view showing an example of a substrate stage apparatus that the liquid crystal exposure apparatus in FIG. 1 is equipped with.

DESCRIPTION OF EMBODIMENTS

First Embodiment

Hereinafter, a first embodiment will be described, with reference to FIGS. 1 to 16B.

Figure 1:
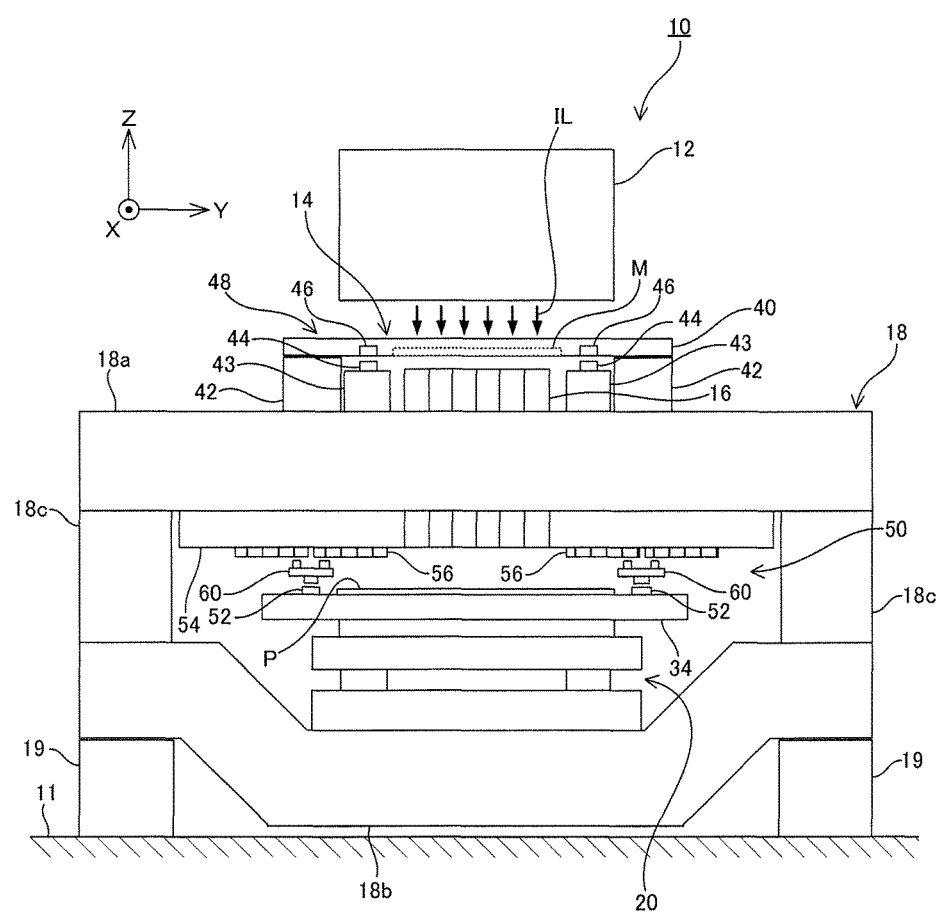
FIG. 1 A view schematically showing a structure of a liquid crystal exposure apparatus according to a first embodiment.

FIG. 1 schematically shows a structure of a liquid crystal exposure apparatus 10 according to a first embodiment. Liquid crystal exposure apparatus 10 is a projection exposure apparatus of a step-and-scan method, or a so-called scanner. The exposure target of liquid crystal exposure apparatus 10 is a glass substrate P (hereinafter simply referred to as a substrate P) having a rectangular-shape (square-shape), used in, for example, a liquid crystal display device (a flat panel display).

Liquid crystal exposure apparatus 10 includes an illumination system 12, a mask stage apparatus 14 that holds a mask M on which a circuit pattern and the like are formed, a projection optical system 16, an apparatus main section 18, a substrate stage apparatus 20 that holds substrate P having a resist (sensitive agent) coated on its surface (the surface facing the +Z side in FIG. 1), and a control system for these parts. In the description below, a direction in which mask M and substrate P are relatively scanned with respect to projection optical system 16 at the time of exposure will be described as an X-axis direction, a direction orthogonal to the X-axis within a horizontal plane will be described as a Y-axis direction, and a direction orthogonal to the X-axis and the Y-axis will be described as a Z-axis direction. Rotation directions around the X-axis, the Y-axis, and the Z-axis will be θx, θy, and θz directions, respectively. Also, positions in regard to the X-axis, the Y-axis, and the Z-axis directions will be described as X position, Y position, and Z position, respectively.

Illumination system 12 is structured similarly to the illumination system disclosed in, for example, U.S. Pat. No. 5,729,331. Illumination system 12 irradiates light emitted from a light source not illustrated (for example, a mercury lamp) on mask M as an illumination light for exposure (illumination light) IL, via parts including a reflection mirror, a dichroic mirror, a shutter, a wavelength selection filter and various kinds of lenses, none of which are illustrated. As illumination light IL, lights such as, for example, i-line (wavelength 365 nm), g-line (wavelength 436 nm), and h-line (wavelength 405 nm) (or a synthetic light of the above i-line, g-line, and h-line) are used.

Mask stage apparatus 14 includes a mask holder 40 that holds mask M by, for example, vacuum chucking, a mask driving system 91 (not illustrated in FIG. 1, refer to FIG. 8) that drives mask holder 40 in a scanning direction (the X-axis direction) in predetermined long strokes as well as finely drive mask holder 40 appropriately in the Y-axis direction and the θz direction, and a mask position measurement system for acquiring position information (including rotation quantity information in the θz direction. The same shall apply hereinafter) of mask holder 40 in an XY plane. Mask holder 40 consists of a frame-shaped member that has an opening section of a rectangular-shape in a planar view formed, as is disclosed in, for example, U.S. Patent Application Publication No. 2008/0030702. Mask holder 40 is mounted on a pair of mask guides 42, via, for example, an air bearing (not shown). The pair of mask guides 42 is fixed to an upper mount section 18a, which is a part of apparatus main section 18. Mask driving system 91, for example, includes a linear motor (not shown).

Mask position measurement system is equipped with a mask encoder system 48. Mask encoder system 48 includes a pair of encoder head units 44 (hereinafter simply referred to as head units 44) fixed to upper mount section 18a via an encoder base 43, and a plurality of encoder scales 46 (overlapping in the depth direction of the page surface of FIG. 1, refer to FIG. 3A) placed corresponding to the above pair of head units 44 on the lower surface of mask holder 40. The structure of mask encoder system 48 will be described in detail later in the description.

Projection optical system 16 is placed below mask stage apparatus 14. Projection optical system 16 is a so-called multi-lens projection optical system whose structure is similar to the projection optical system disclosed in, for example, U.S. Pat. No. 6,552,775, and is equipped with a plurality of optical systems (e.g., 11 in the embodiment, refer to FIG. 3A) that form upright images with, for example, a double telecentric non-magnification system.

In liquid crystal exposure apparatus 10, when an illumination area on mask M is illuminated by illumination light IL from illumination system 12, the illumination light that has passed mask M forms a projection image (a part of an erected image) of the circuit pattern of mask M within the illumination area via projection optical system 16, on substrate P in an irradiation area (exposure area) of the illumination light conjugate to the illumination area. Then, scanning exposure is performed of a shot area on substrate P, by mask M relatively moving in the scanning direction with respect to the illumination area (illumination light IL) as well as substrate P relatively moving in the scanning direction with respect to the exposure area (illumination light IL), and the pattern formed on mask M is transferred on the shot area.

Apparatus main section 18, which supports the above mask stage apparatus 14 and projection optical system 16, is installed on a floor 11 of a clean room via a plurality of anti-vibration devices 19. Apparatus main section 18, which is structured similarly to the apparatus main section disclosed in, for example, U.S. Patent Application Publication No. 2008/0030702, has upper mount section 18a (also referred to as an optical surface plate) for supporting projection optical system 16, a pair of lower mount sections 18b (one of the pair is not shown in FIG. 1 because of being arranged overlapping in the depth direction of the page surface, refer to FIG. 2), and a pair of middle mound sections 18c.

Substrate stage apparatus 20, which is for positioning substrate P with high precision with respect to projection optical system 16 (exposure light IL), drives substrate P along a horizontal plane (the X-axis direction and the Y-axis direction) with predetermined long strokes, as well as drive substrate P finely in directions of six degrees of freedom. Although the structure of substrate stage apparatus 20 is not restricted in particular, it is preferable to use a stage apparatus of a so-called coarse/fine movement structure that includes a gantry type two-dimensional coarse movement stage and a fine movement stage which is driven finely with respect to the two-dimensional coarse movement stage, as is disclosed in, for example, U.S. Patent Application Publication No. 2008/129762, or in U.S. Patent Application Publication No. 2012/0057140.

Figure 2:
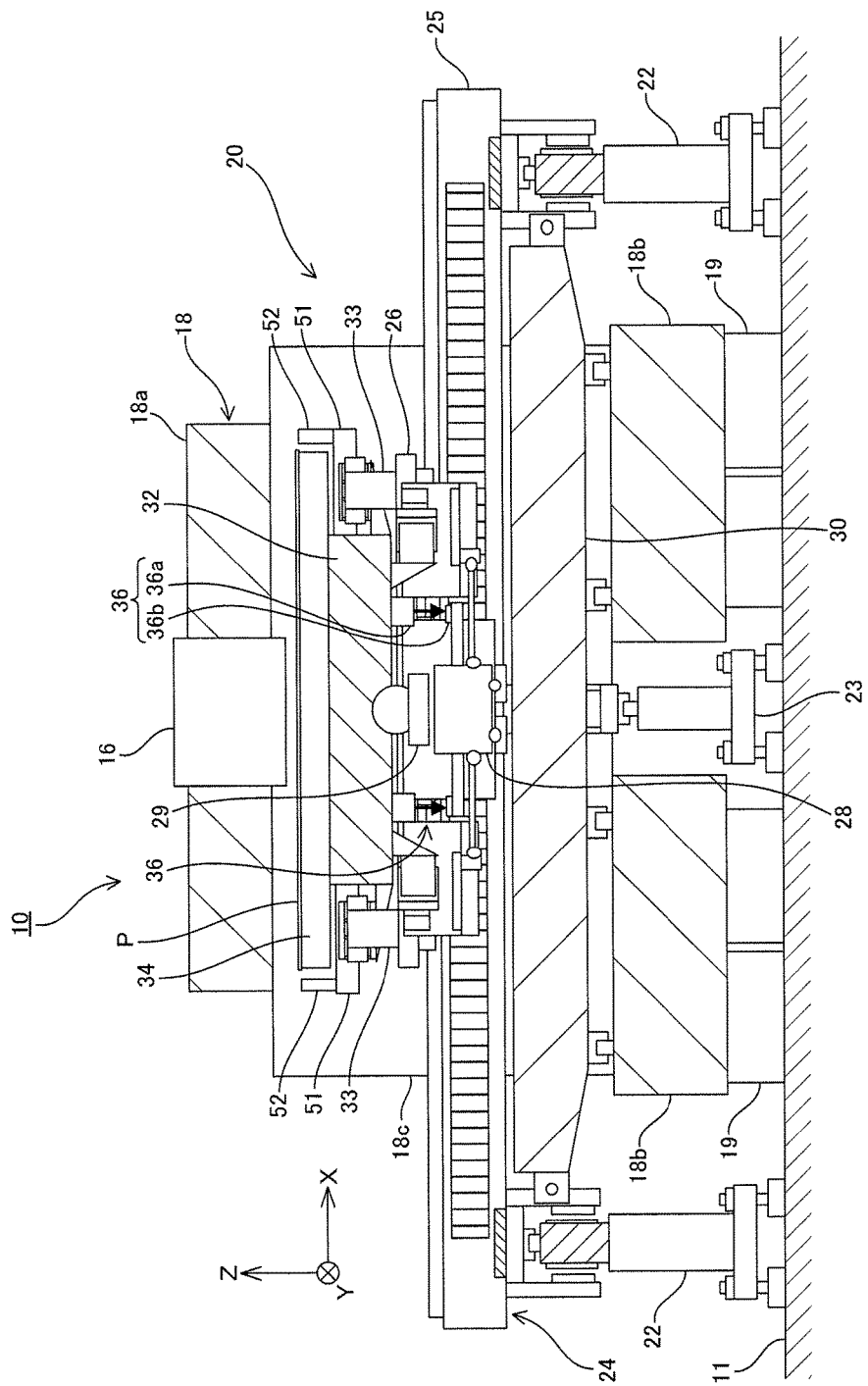

FIG. 2 shows an example of substrate stage apparatus 20 of the so-called coarse/fine movement structure used in liquid crystal exposure apparatus 10 of the present embodiment. Substrate stage apparatus 20 is equipped with a pair of base frames 22, a Y coarse movement stage 24, an X coarse movement stage 26, a weight-canceling device 28, a Y step guide 30, and a fine movement stage 32.

Base frame 22, which consists of a member extending in the Y-axis direction, is installed on floor 11 in a state vibrationally isolated from apparatus main section 18. An auxiliary base frame 23 is also placed, in between the pair of lower mount sections 18b of apparatus main section 18. Y coarse movement stage 24 has a pair of X beams 25 (one of the pair is not shown in FIG. 2) laid extending over the pair of base frames 22. Auxiliary base frame 23 previously described supports the center in the longitudinal direction of X beam 25 from below. Y coarse movement stage 24 is driven with predetermined long strokes in the Y-axis direction on the pair of base frames 22 via a plurality of Y linear motors, which are a part of a substrate driving system 93 (not shown in FIG. 2, refer to FIG. 8) for driving substrate P in directions of six degrees of freedom. X coarse movement stage 26 is mounted on Y coarse movement stage 24 in a state built over the pair of X beams 25. X coarse movement stage 26 is driven with predetermined long strokes in the X-axis direction on Y coarse movement stage 24 via a plurality of X linear motors, which are a part of substrate driving system 93. Since X coarse movement stage 26 has its relative movement mechanically restricted in the Y-axis direction with respect to the Y coarse movement stage 24, it is moved in the Y-axis direction integrally with Y coarse movement stage 24.

Weight-canceling device 28 is inserted between the pair of X beams 25, and is also mechanically joined to X coarse movement stage 26. This allows weight-canceling device 28 to move in predetermined long strokes in the X-axis and/or Y-axis direction(s) integrally with X coarse movement stage 26. Y step guide 30, which consists of a member extending in the X-axis direction, is mechanically joined to Y coarse movement stage 24. This allows Y step guide 30 to move in predetermined long strokes in the Y-axis direction integrally with Y coarse movement stage 24. The above weight-canceling device 28 is mounted on Y step guide 30 via a plurality of air bearings. Weight-canceling device 28, when X coarse movement stage 26 moves only in the X-axis direction, moves in the X-axis direction on Y step guide 30 which is in a stationary state, and when X coarse movement stage 26 moves in the Y-axis direction (including the case when there is movement also in the X-axis direction), moves in the Y-axis direction integrally with Y step guide 30 (so as not to fall from Y step guide 30).

Fine movement stage 32, which consists of a plate shaped (or a boxlike) member having a rectangular shape in a planar view, is supported from below in the center by weight-canceling device 28 via a spherical bearing device 29, in a state freely swingable with respect to the XY plane. A substrate holder 34 is fixed to the upper surface of fine movement stage 32, and substrate P is mounted on substrate holder 34. Fine movement stage 32, which includes a stator that X coarse movement stage 26 has and a mover that fine movement stage 32 has, is finely driven by a plurality of linear motors 33 (e.g., voice coil motors) that structure a part of substrate driving system 93 (not shown in FIG. 2, refer to FIG. 8) described above in directions of six degrees of freedom with respect to X coarse movement stage 26. Fine movement stage 32 also moves in predetermined long strokes in the X-axis and/or Y-axis direction(s) along with X coarse movement stage 26, according to thrust given by X coarse movement stage 26 via the above plurality of linear motors 33. Details of the structure of substrate stage apparatus 20 described so far (excluding the measurement system) are disclosed in, for example, U.S. Patent Application Publication No. 2012/0057140.

Figure 8:
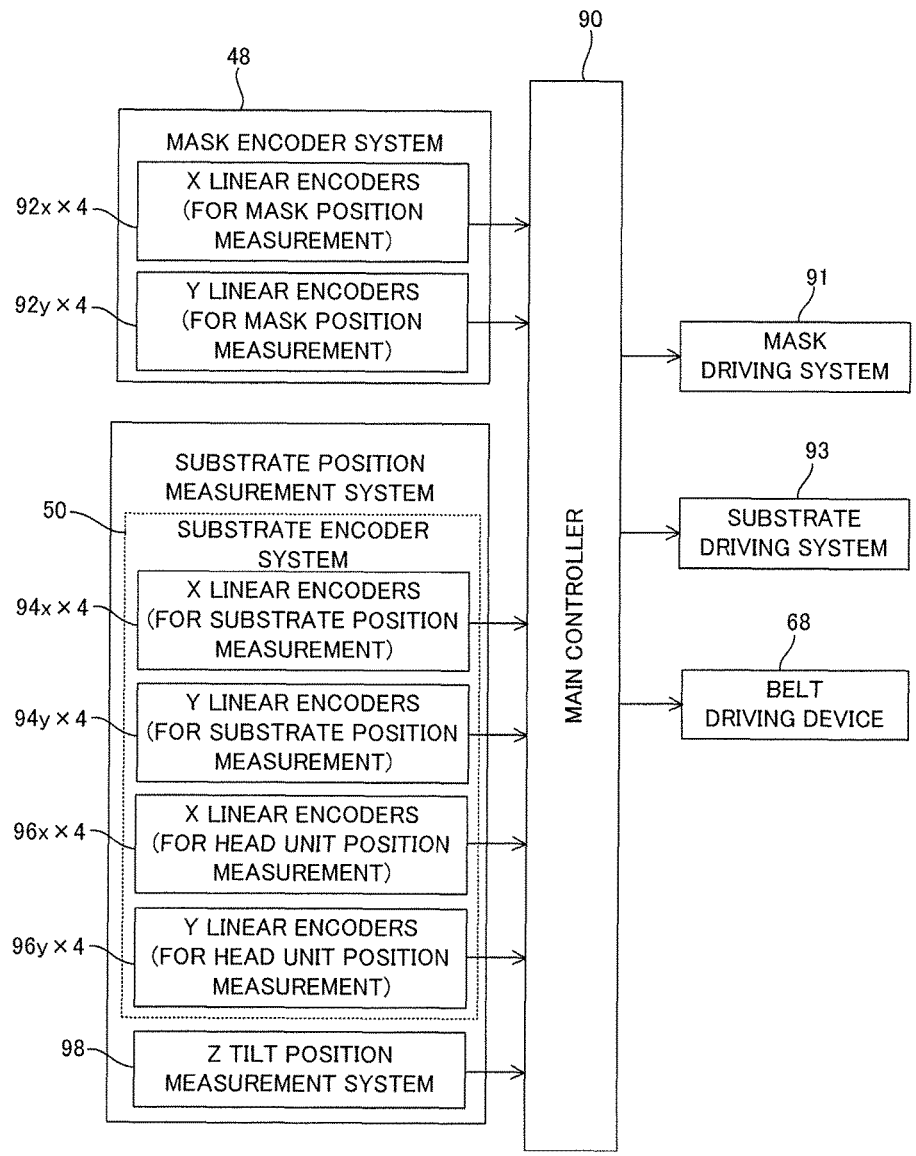
FIG. 8 A block diagram showing an input/output relation of a main controller that mainly structures a control system of the liquid crystal exposure apparatus.

Further, substrate stage apparatus 20 has a substrate Position measurement system for acquiring position information of fine movement stage 32 (namely, substrate holder 34 and substrate P) in directions of six degrees of freedom. The substrate Position measurement system includes a Z tilt position measurement system 98 for acquiring position information of substrate P in the Z-axis, the θx, and θy directions (hereinafter referred to as a Z tilt direction), and a substrate encoder system 50 for acquiring position information of substrate P in the XY plane, as is shown in FIG. 8. Z tilt position measurement system 98 is equipped with a plurality of Z sensors 36 that includes a probe 36a attached to the lower surface of fine movement stage 32 and a target 36b attached to weight-canceling device 28, as is shown in FIG. 2. The plurality of Z sensors 36, e.g., four (at least three), are placed at a predetermined spacing, around an axis parallel to the Z-axis which passes through the center of fine movement stage 32. A main controller 90 (refer to FIG. 8) acquires Z position information, and rotation quantity information in the θx and θy directions of fine movement stage 32, on the basis of the output of the above plurality of Z sensors 36.

The structure of Z tilt position measurement system 98 including the above Z sensors 36 is disclosed in detail in, for example, U.S. Patent Application Publication No. 2010/0018950. The structure of substrate encoder system 50 will be described later in the description.

Figure 3A:
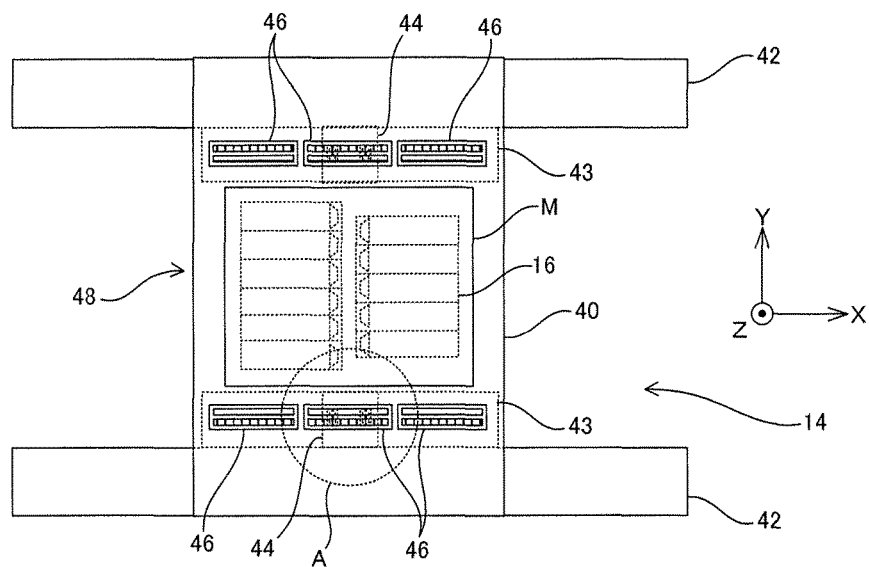
FIG. 3A is a view schematically showing a structure of a mask encoder system.

Next, the structure of mask encoder system 48 will be described, using FIGS. 3A and 3B. As is typically shown in FIG. 3A, a plurality of encoder scales 46 (hereinafter simply referred to as scales 46) are placed in areas on the +Y side and the −Y side of mask M (more specifically, an opening section not shown for housing mask M) in mask holder 40. Although FIG. 3A illustrates the plurality of scales 46 in a solid line placed on the upper surface of mask holder 40 to facilitate understanding, the plurality of scales 46 are actually placed at the lower surface side of mask holder 40 so that the Z position of the lower surface of each of the plurality of scales 46 coincides with the Z position of the lower surface (pattern surface) of mask M, as illustrated in FIG. 1.

In mask holder 40 of the present embodiment, scales 46 are placed in the X-axis direction at a predetermined spacing, e.g., three each, in the areas on the +Y side and −Y side of mask M. That is, mask holder 40 has a total of, e.g., six scales 46. The plurality of scales 46 are each substantially the same at the +Y side and −Y side of mask M, except for the point that the scales are placed symmetrically in the vertical direction of the page surface. Scales 46 consist of plate-like (strip-shaped) members with a rectangular-shape in a planar view extending in the X-axis direction, made of, for example, quartz glass. Mask holder 40 is made of, for example, ceramics, and the plurality of scales 46 are fixed to mask holder 40.

Figure 3B:
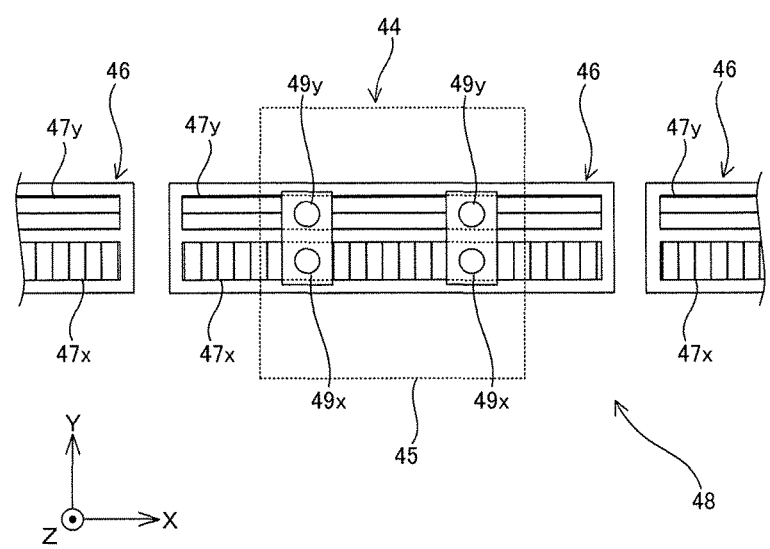
FIG. 3B is an enlarged view of a part of the mask encoder system (section A in FIG. 3A).

As is shown in FIG. 3B, X scales 47x are formed in areas on one side (the −Y side in FIG. 3B) in the width direction at the lower surface (the surface facing the −Z side in the present embodiment) of scales 46. Also, Y scales 47y are formed in areas on the other side (the +Y side in FIG. 3B) in the width direction on the lower surface of scales 46. X scales 47x, which are formed at a predetermined pitch in the X-axis direction (the X-axis direction being the periodic direction), are structured by reflection type diffraction gratings (X gratings) which have a plurality of grid lines extending in the Y-axis direction. Similarly, Y scales 47y, which are formed at a predetermined pitch in the Y-axis direction (the Y-axis direction being the periodic direction), are structured by reflection type diffraction gratings (Y gratings) which have a plurality of grid lines extending in the X-axis direction. In X scales 47x and Y scales 47y of the present embodiment, the plurality of grid lines are formed, for example, at a spacing of 10 nm or less. The spacing (pitch) between the grids shown in FIGS. 3A and 3B are illustrated remarkably wider than the actual spacing, for convenience of illustration. The same can be said for other drawings.

Further, as shown in FIG. 1, a pair of encoder bases 43 is fixed to the upper surface of upper mount section 18a. The pair of encoder bases 43 is placed, so that one of the pair is at the −X side of mask guide 42 at the +X side, and the other is at the +X side of mask guide 42 at the −X side (that is, placed in the area between the pair of mask guides 42). A part of the above projection optical system 16 is also placed between the pair of encoder bases. Encoder base 43 consists of a member extending in the X-axis direction, as shown in FIG. 3A. The pair of encoder bases 43 each has an encoder head unit 44 (hereinafter simply referred to as a head unit 44) fixed to the center portion in the longitudinal direction. That is, head unit 44 is fixed to apparatus main section 18 (refer to FIG. 1) via encoder base 43. Since the pair of head units 44 are substantially the same at the +Y side and −Y side of mask M, except for the point that the units are placed symmetrically in the vertical direction of the page surface, only one of the pair of head units (the −Y side unit) will be described below.

Head unit 44, as shown in FIG. 3B, has a unit base 45 which consists of a plate-like member with a rectangular-shape in a planar view. A pair of X heads 49x placed apart in the X-axis direction and a pair of Y heads 49y placed apart in the X-axis direction are fixed to unit base 45. That is, mask encoder system 48 has, e.g., four X heads 49x, along with, e.g., four Y heads 49y. Although FIG. 3B illustrates one of the X heads 49x and one of the Y heads 49 placed within a single housing and the other X head 49x and the other Y head 49y placed within another housing, the pair of X heads 49x and the pair of Y heads 49y may each be placed independently. Also, although FIG. 3B illustrates the pair of X heads 49x and the pair of Y heads 49y placed above (the +Z side) scale 46 to facilitate understanding, the pair of X heads 49x are actually placed below X scale 47y, and the pair of Y heads 49y are actually placed below Y scale 47y (refer to FIG. 1).

The pair of X heads 49x and the pair of Y heads 49y are fixed to unit base 45, so that the distance between the pair of X heads 49x and the distance between the pair of Y heads 49y do not change, for example, due to vibration or the like. Also, unit base 45 itself is formed using a material whose thermal expansion is lower than scale 46 (or equal to scale 46) so that the distance between the pair of X heads 49x and the distance between the pair of Y heads 49y do not change, for example, due to temperature change or the like.

X heads 49x and Y heads 49y, which are encoder heads of the so-called diffraction interference method as is disclosed in, for example, U.S. Patent Application Publication No. 2008/0094592, irradiate measurement beams on the corresponding scales (X scales 47x and Y scales 47y) and by receiving the beams from the scales, supply information on displacement quantity of mask holder 40 (namely mask M, refer to FIG. 3A) to main controller 90 (refer to FIG. 8). That is, in mask encoder system 48, for example, four X heads 49x and X scales 47x (different depending on the X position of mask holder 40) facing X heads 49x structure, for example, four X linear encoders 92x (not shown in FIG. 3B, refer to FIG. 8) for acquiring position information of mask M in the X-axis direction, and for example, four Y heads 49y and Y scales 47y (different depending on the X position of mask holder 40) facing Y heads 49y structure, for example, four Y linear encoders 92y (not shown in FIG. 3B, refer to FIG. 8) for acquiring position information of mask M in the Y-axis direction.

Main controller 90 acquires position information of mask holder 40 in the X-axis direction and the Y-axis direction, on the basis of the output of, for example, the four X linear encoders 92x, and for example, the four Y linear encoders 92y, at a resolution of, for example, 10 nm or less, as shown in FIG. 8. Main controller 90 also acquires 19Z position information (rotation quantity information) of mask holder 40, on the basis of at least two outputs of, e.g., the four X linear encoders 92x (or, for example, four Y linear encoders 92y). Main controller 90 controls the position of mask holder 40 in the XY plane, using mask driving system 91, on the basis of position information of mask holder 40 within the XY plane acquired from measurement values of the above mask encoder system 48.

Now, as shown in FIG. 3A, mask holder 40 has, for example, three scales 46, placed in the X-axis direction at a predetermined spacing in each of the areas at the +Y side and the −Y side of mask M, as is described above. In addition, mask holder 40 is driven in the X-axis direction, between a position where head unit 44 (all of the pair of X heads 49x and the pair of Y heads 49y (each refer to FIG. 3B)) faces scale 46 located outermost to the +X side of, for example, the three scales 46 placed in the X-axis direction at a predetermined spacing, and a position where head unit 44 faces scale 46 located outermost to the −X side.

And, in mask stage apparatus 14 of the present embodiment, the spacing between each head of the pair of X heads 49x and each head of the pair of Y heads 49y that one head unit 44 has is set wider than the spacing between the adjacent scales 46, as shown in FIG. 3B. This allows at least one head of the pair of X heads 49x to constantly face X scale 47x and at least one head of the pair of Y heads 49y to constantly face Y scale 47y, in mask encoder system 48. Mask encoder system 48, therefore, is able to supply position information of mask holder 40 (refer to FIG. 3A) to main controller 90 (refer to FIG. 8) without interruption.

Specifically, for example, when mask holder 40 (refer to FIG. 3A) moves to the +X side, mask encoder system 48 moves through the following state in the order below; a first state in which the pair of heads 49x both face X scale 47x at the +X side of the pair of X scales 47x which are adjacent (the state shown in FIG. 3B), a second state in which X head 49x at the −X side faces an area between the above pair of X scales 47x which are adjacent (facing neither of the X scales 47x) and X head 49x at the +X side faces the above X scale 47x at the +X side, a third state in which X head 49x at the −X side faces the above X scale 47x at the −X side and X head 49x at the +X side also faces X scale 47x at the +X side, a fourth state in which X head 49x at the −X side faces scale 47x at the −X side and X head 49x at the +X side faces an area between the pair of X scales 47x (facing neither of the X scales 47x), and a fifth state in which the pair of heads 49x both face X scale 47x at the −X side. Therefore, at least one of the X heads 49x constantly faces X scale 47x.

Main controller 90 (refer to FIG. 8) acquires position information of mask holder 40 on the basis of the average value of the output of the pair of X heads 49 in the above first, third and fifth states. Main controller 90 also acquires X position information of mask holder 40 on the basis of only the output of X head 49x at the +X side in the above second state, and acquires X position information of mask holder 40 on the basis of only the output of X head 49x at the −X side in the above fourth state. Therefore, the measurement values of mask encoder system 48 are successively acquired without interruption.

Next, a structure of substrate encoder system 50 will be described. Substrate encoder system 50, as shown in FIG. 1, is equipped with a plurality of encoder scales 52 placed at substrate stage apparatus 20 (overlapping in the depth direction of the page surface of FIG. 1, refer to FIG. 4A), an encoder base 54 fixed to the lower surface of upper mount section 18a, a plurality of encoder scales 56 fixed to the lower surface of encoder base 54, and a pair of encoder head units 60.

In substrate stage apparatus 20 of the present embodiment in areas at the +Y side and the −Y side of substrate P, for example, five encoder scales 52 (hereinafter simply referred to as scales 52) are placed in the X-axis direction at a predetermined spacing, as is typically shown in FIG. 4A. That is, substrate stage apparatus 20 has a total of, for example, 10 scales 52. The plurality of scales 52 are each substantially the same, except for the point that the scales at the +Y side and −Y side of substrate P are placed symmetrically in the vertical direction of the page surface. Scales 52 consist of plate-like (strip-shaped) members with a rectangular-shape in a planar view extending in the X-axis direction, made of, for example, quartz glass, similarly to scales 46 (refer to FIG. 3A for each scale) of the above mask encoder system 48.

Figure 4A:
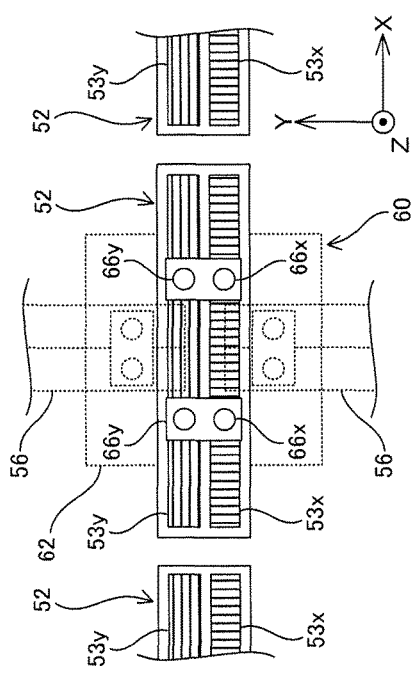
FIG. 4A is a view schematically showing a structure of a substrate encoder system.

Note that, although the plurality of scales 52 are illustrated so that the scales appear to be fixed to the upper surface of substrate holder 34 to facilitate understanding in FIGS. 1 and 4A, the plurality of scales 52 are actually fixed to fine movement stage 32 via scale bases 51 in a state separate from substrate holder 34, as shown in FIG. 2 (note that FIG. 2 illustrates the case when the plurality of scales 52 are placed at the +X side and −X side of substrate P). In some cases, however, the plurality of scales 52 may actually be fixed on substrate holder 34. The description below will be made assuming that the plurality of scales 52 are placed on substrate holder 34.

Figure 4B:
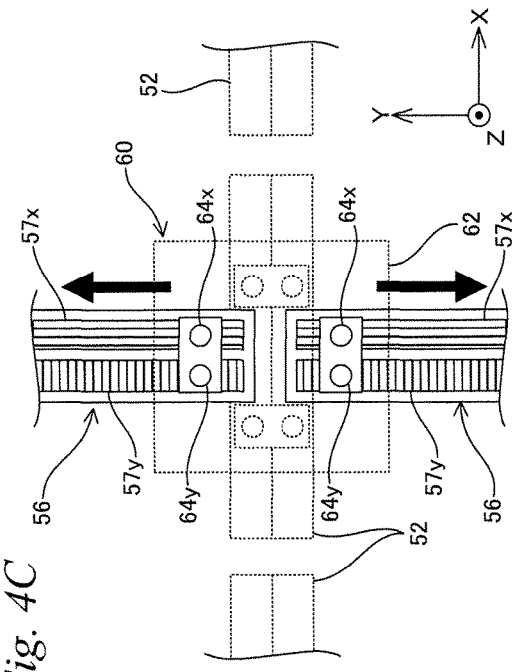
FIGS. 4B and 4C are enlarged views of a part of the substrate encoder system (section B in FIG. 4A).

As shown in FIG. 4B, X scales 53x are formed in areas on one side (the −Y side in FIG. 4B) in the width direction on the upper surface of scales 52. Also, Y scales 53y are formed in areas on the other side (the +Y side in FIG. 4B) in the width direction on the upper surface of scales 52. Since the structure of X scales 53*x* and Y scales 53*y* is the same as X scales 47*x* and Y scales 47*y* (refer to FIG. 3B for each scale) formed on scales 46 of the above mask encoder system 48 (refer to FIG. 3A for each part), the description thereabout will be omitted.

Figure 5:
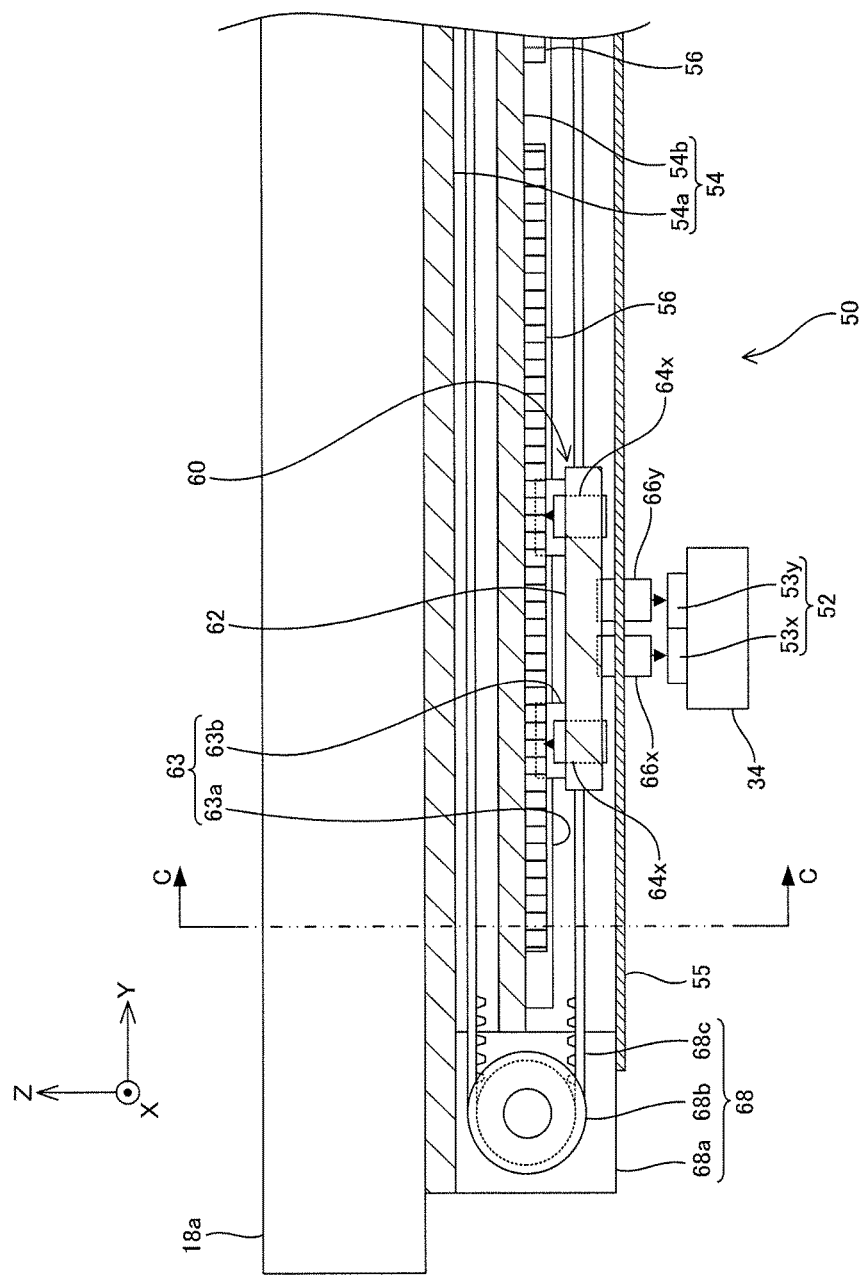
FIG. 5 A side view of a head unit that the substrate encoder system has.
Figure 6:
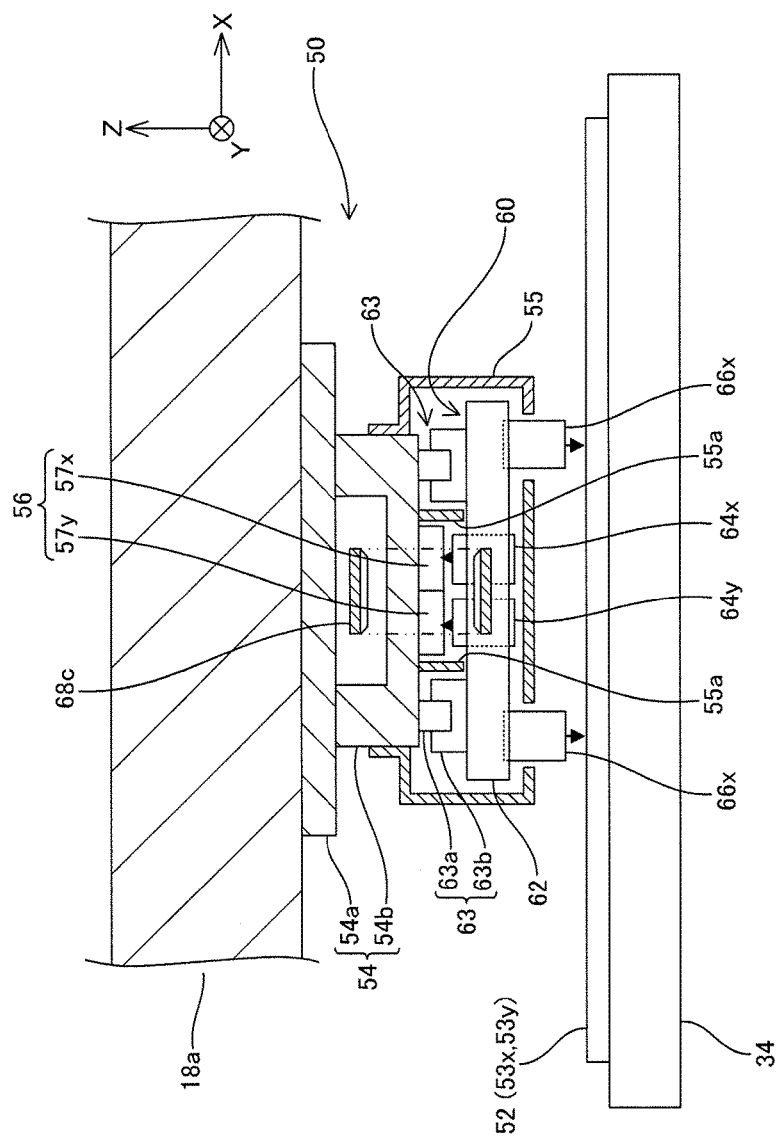
FIG. 6 A sectional view of line C-C in FIG. 5.

Encoder base 54, as it can be seen from FIGS. 5 and 6, is equipped with a first section 54*a*, which consists of a plate-like member extending in the Y-axis direction fixed to the lower surface of upper mount section 18*a*, and a second section 54*b*, which consists of a member having a U-shaped XZ section extending in the Y-axis direction fixed to the lower surface of the first section 54*a*. Encoder base 54, as a whole, is formed in a cylindrical shape extending in the Y-axis direction. Although the X position of encoder base 54 roughly coincides with the X position of the center of projection optical system 16 as shown in FIG. 4A, encoder base 54 is placed free from contact with projection optical system 16. Encoder base 54 and projection optical system 16 may also be separately placed; at the +Y side and the −Y side. To the lower surface of encoder base 54, a pair of Y linear guides 63*a* is fixed, as shown in FIG. 6. The pair of Y linear guides 63*a* each consists of a member extending in the Y-axis direction, and are placed parallel to each other at a predetermined spacing in the X-axis direction.

To the lower surface of encoder base 54, a plurality of encoder scales 56 (hereinafter simply referred to as scales 56) are fixed. Scales 56 in the present embodiment are placed as shown in FIG. 1, with, for example, two scales in the area at the +Y side of projection optical system 16, and for example, two scales in the area at the −Y side of projection optical system 16, with the scales set apart in the Y-axis direction. That is, a total of, for example, four scales 56 are fixed to encoder base 54. Each of the plurality of scales 56 is substantially the same. Scales 56, which consist of plate-like (strip-shaped) members with a rectangular-shape in a planar view extending in the Y-axis direction, are made of, for example, quartz glass, similarly to scales 52 placed on substrate stage apparatus 20. Although FIG. 4A illustrates the plurality of scales 56 in a solid line placed on the upper surface of encoder base 54 to facilitate understanding, the plurality of scales 56 are actually placed at the lower surface side of encoder base 54, as illustrated in FIG. 1.

Figure 4C:
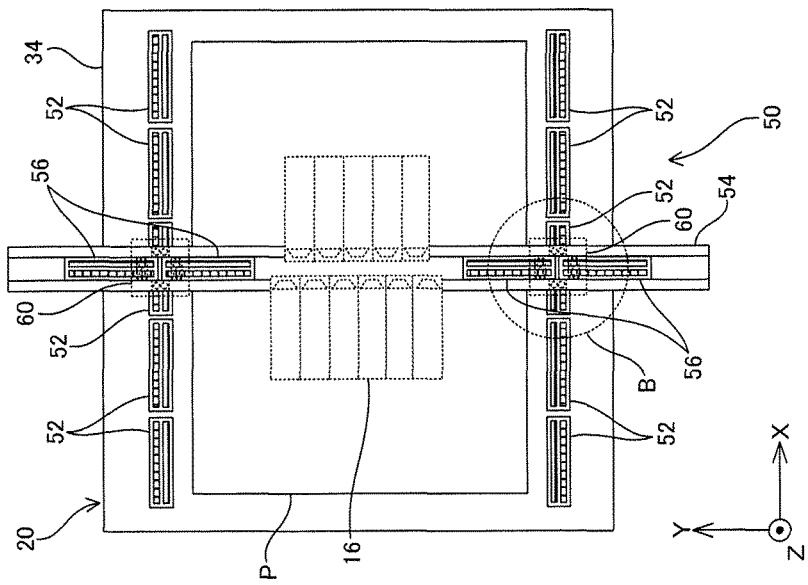

As shown in FIG. 4C, X scales 57*x* are formed in areas on one side (the +X side in FIG. 4C) in the width direction on the lower surface of scales 56. Also, Y scales 57*y* are formed in areas on the other side (the −X side in FIG. 4C) in the width direction on the lower surface of scales 56. Since the structure of X scales 57*x* and Y scales 57*y* is the same as X scales 47*x* and Y scales 47*y* (refer to FIG. 3B for each scale) formed on scales 46 of the above mask encoder system 48 (refer to FIG. 3A for each part), the description thereabout will be omitted.

Referring back to FIG. 1, the pair of encoder head units 60 (hereinafter simply referred to as head units 60) is placed apart in the Y-axis direction below encoder base 54. Since each of the pair of head units 60 is substantially the same except for the point that the head units are placed symmetrically in the lateral direction of the page surface in FIG. 1, hereinafter only one of the head units (at the −Y side) will be described. Head unit 60, as shown in FIG. 5, is equipped with a Y slide table 62, a pair of X heads 64*x*, a pair of Y heads 64*y* (not shown in FIG. 5 because of being hidden behind the pair of X heads 64*x* in the depth of the page surface, refer to FIG. 4C), a pair of X heads 66*x* (one of the X heads 66*x* is not shown in FIG. 5, refer to FIG. 4B), a pair of Y heads 66*y* (one of the Y heads 66*y* is not shown in FIG. 5, refer to FIG. 4B), and a belt driving device 68 for driving Y slide table 62 in the Y-axis direction.

Y slide table 62, which consists of a plate-like member having a rectangular-shape in a planar view, is placed below encoder base 54 via a predetermined clearance with respect to encoder base 54. Y slide table 62 is also set, so that the Z position is to the +Z side than that of substrate holder 34 which substrate stage apparatus 20 has (each refer to FIG. 1), regardless of the Z tilt position of substrate holder 34.

To the upper surface of Y slide table 62, as shown in FIG. 6, a plurality of Y slide members 63*b* (e.g., two (refer to FIG. 5) with respect to one Y linear guide 63*a*) is fixed that engages with the above Y linear guide 63*a* in a freely slidable manner in the Y-axis direction via a rolling body not shown (for example, a plurality of balls of a circulation type). Y linear guide 63*a* and Y slide members 63*b* corresponding to Y linear guide 63*a* structure a mechanical Y linear guide device 63, as is disclosed in, for example, U.S. Pat. No. 6,761,482, and Y slide table 62 is guided straightforward in the Y-axis direction with respect to encoder base 54, via the pair of Y linear guide devices.

Belt driving device 68, as shown in FIG. 5, is equipped with a rotation driving device 68*a*, a pulley 68*b*, and a belt 68*c*. Note that belt driving device 68 can be placed independently for driving slide table 62 at the −Y side and for driving slide table 62 at the +Y side (not shown in FIG. 5, refer to FIG. 4A), or the pair of Y slide tables 62 may be driven integrally by a single belt driving device 68.

Rotation driving device 68*a*, which is fixed to encoder base 54, is equipped with a rotation motor (not shown). Main controller 90 (refer to FIG. 8) controls the number of rotations and the rotation direction of the rotation motor. Rotation driving device 68*a* rotationally drives pulley 68*b* around an axis parallel to the X-axis. Belt driving device 68, although it is not illustrated, has another pulley, which is placed apart in the Y-axis direction from the above pulley 68*b* and is attached to encoder base 54 in a state freely rotatable around the axis parallel to the X-axis. Belt 68*c* has one end and the other end connected to Y slide table 62, in addition to having two places at the mid portion in the longitudinal direction of the belt wound around the above pulley 68*b* and the another pulley (not shown), in a state where a predetermined tension is given to the pulleys. A part of belt 68*c* is inserted into encoder base 54, for example, so as to suppress adhesion of dust from belt 68*c* on scales 52 and 56. By pulley 68 being rotationally driven, Y slide table 62 is pulled by belt 68*c* and moves back and forth with predetermined strokes in the Y-axis direction.

Main controller 90 (refer to FIG. 8) synchronously drives, as appropriate, one of the head units 60 (the +Y side) placed further to the +Y side than projection optical system 16, for example, below two scales 56, and the other of the head units 60 (the −Y side) placed further to the −Y side than projection optical system 16, for example, below two scales 56, with predetermined strokes in the Y-axis direction. Note that although belt driving device 68 including toothed pulley 68*b* and toothed belt 68*c* is used as an actuator for driving Y slide table 62, the present embodiment is not limited to this, and a friction wheel device including a pulley without teeth and a belt may also be used. In addition, the flexible member that pulls Y slide table 62 is not limited to a belt, and may also be members such as, for example, a rope, a wire, or a chain. In addition, the kind of actuator for driving Y slide table 62 is not limited to belt driving device 68, and may be other driving devices such as, for example, a linear motor or a feed screw device.

X head 64x, Y head 64y (not shown in FIG. 5, refer to FIG. 6) X head 66x and Y head 66y, which are each an encoder head of the so-called diffraction interference method similar to X head 49x and Y head 49y that the above mask encoder system 48 has, are fixed to Y slide table 62. Now, in head unit 60, the pair of Y heads 64y, the pair of X heads 64x, the pair of Y heads 66y and the pair of X heads 66x are fixed to Y slide table 62, so that the distance between the heads of each pair does not change due to, for example, vibration or the like. Y slide table 62 itself also is formed of a material having a thermal expansion coefficient lower than scales 52 and 56 (or equal to scales 52 and 56), so that the distance does not change between the heads of each pair; the pair of Y heads 64y, the pair of X heads 64x, the pair of Y heads 66y and the pair of X heads 66x, due to, for example, temperature change or the like.

Figure 7:
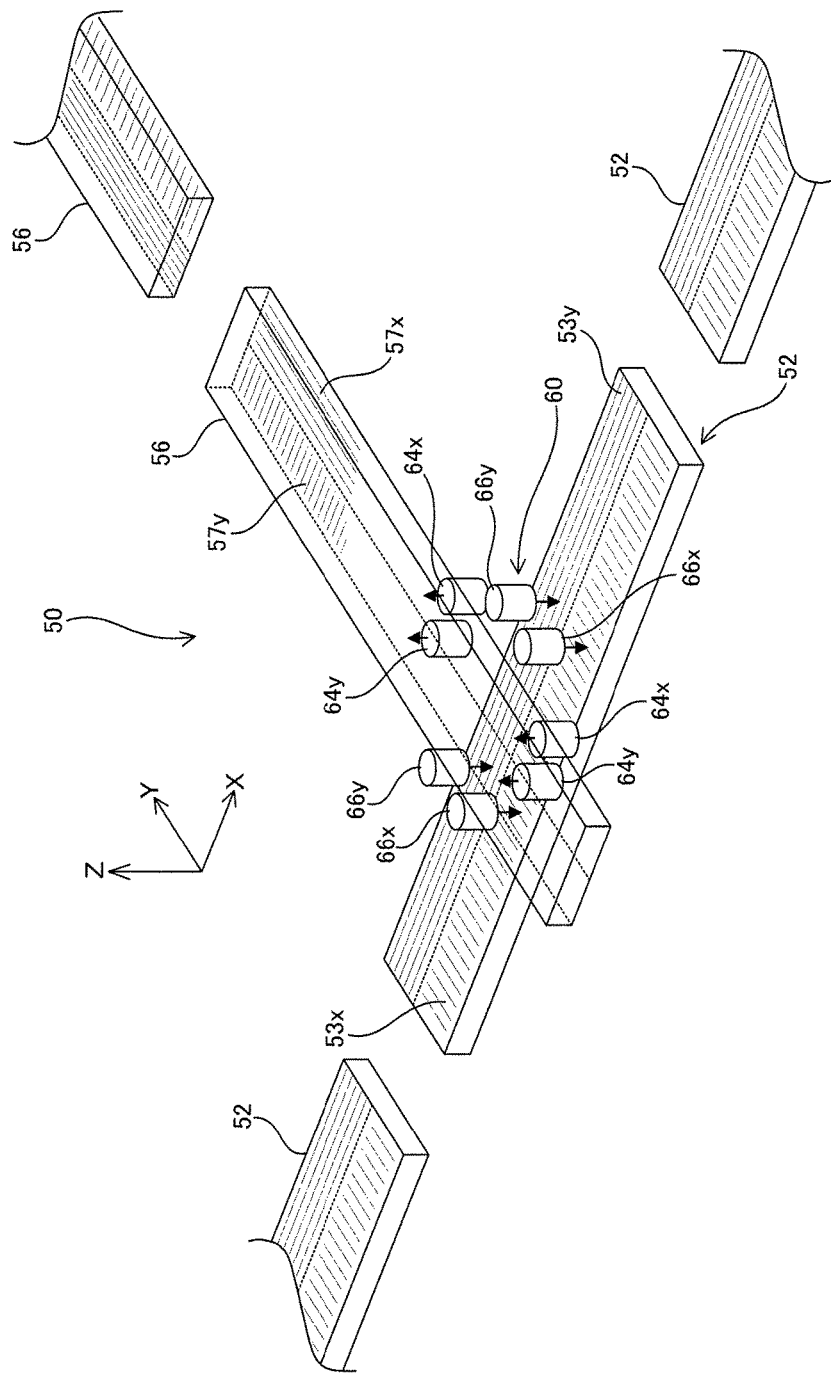
FIG. 7 A conceptual diagram of the substrate encoder system.

As shown in FIG. 7, two places (two points) separate from each other in the Y-axis direction on X scale 57x are irradiated with measurement beams from the pair of X heads 64x, and two places (two points) separate from each other in the Y-axis direction on Y scale 57y are irradiated with measurement beams from the pair of Y heads 64y. Substrate encoder system 50 supplies information on displacement quantity of Y slide table 62 (not shown in FIG. 7, refer to FIGS. 5 and 6) to main controller 90 (refer to FIG. 8) by receiving beams from scales corresponding to the above X heads 64x and Y heads 64y. That is, in substrate encoder system 50, for example, four X heads 64x and X scales 57x (different according to the Y position of Y slide table 62) facing the X heads 64x structure, for example, four linear encoders 96x (not shown in FIG. 7, refer to FIG. 8) used for acquiring position information in the Y-axis direction of each of the pair of Y slide tables 62 (that is, the pair of head units 60 (refer to FIG. 1)). And, in substrate encoder system 50, for example, four Y heads 64y and Y scales 57y (different according to the Y position of Y slide table 62) facing the Y heads 64y structure, for example, four Y linear encoders 96y (not shown in FIG. 7, refer to FIG. 8) used for acquiring position information in the Y-axis direction of each of the pair of Y slide tables 62.

Main controller 90 acquires position information of each of the pair of head units 60 (refer to FIG. 1) in the X-axis direction and the Y-axis direction at a resolution of, for example, 10 nm or less, on the basis of the output of, e.g., the four X linear encoders 96x, and e.g., the four Y linear encoders 96y, as shown in FIG. 8. Main controller 90 also acquires 19Z position information (rotation quantity information) of one of the head units 60, on the basis of the output of, e.g., two X linear encoders 96x (or, e.g., two Y linear encoders 96y) corresponding to the one head unit 60, and acquires 19Z position information (rotation quantity information) of the other head unit 60, on the basis of the output of, e.g., two X linear encoders 96x (or, e.g., two Y linear encoders 96y) corresponding to the other head unit 60. Main controller 90 controls the position of head unit 60 in the Y-axis direction using belt driving device 68, on the basis of the position information of each of the pair of head units 60 within the XY plane.

Now, as shown in FIG. 4A, at encoder base 54, scales 56, e.g., two scales, are placed at a predetermined spacing in the Y-axis direction in areas at the +Y side and −Y side of projection optical system 16, as is described above. Of the above two scales 56, e.g., placed at a predetermined spacing in the Y-axis direction, Y slide table 62 is driven in the Y-axis direction between a position where head unit 60 (all of the pair of X heads 64x and the pair of Y heads 64y (refer to FIG. 4C for each head)) faces scale 56 at the +Y side and a position where head unit 60 faces scale 56 at the −Y side.

Similarly to the above mask encoder system 48, also in substrate encoder system 50, the spacing between each head of the pair of X heads 64x and each head of the pair of Y head 64y that one head unit 60 has is set wider than the spacing between the adjacent scales 56, as shown in FIG. 4C. This allows at least one head of the pair of X heads 64x to constantly face X scale 57x and at least one head of the pair of Y heads 64y to constantly face Y scale 57y, in substrate encoder system 50. Substrate encoder system 50, therefore, is able to acquire position information of Y slide table 62 (head unit 60) without interrupting the measurement values.

Also, as shown in FIG. 7, two places (two points) separate from each other in the X-axis direction on X scale 53 are irradiated with measurement beams from the pair of X heads 66x, and two places (two points) separate from each other in the X-axis direction on Y scale 53y are irradiated with measurement beams from the pair of Y heads 66y. Substrate encoder system 50 supplies information on displacement quantity of substrate holder 34 (not shown in FIG. 7, refer to FIG. 2) to main controller 90 (refer to FIG. 8), by receiving beams from scales corresponding to the above X heads 66x and Y heads 66y (not shown in FIG. 7, refer to FIG. 2). That is, in substrate encoder system 50, for example, four X heads 66x and X scales 53x (different depending on the X position of substrate holder 34) facing X heads 66x structure, for example, four X linear encoders 94x (not shown in FIG. 7, refer to FIG. 8) for acquiring positional information of substrate P in the X-axis direction, and, for example, four Y heads 66y and Y scales 53y (different depending on the X position of substrate holder 34) facing Y heads 66y structure, for example, four Y linear encoders 94y (not shown in FIG. 7, refer to FIG. 8) for acquiring position information of substrate P in the Y-axis direction.

Main controller 90 acquires position information of substrate holder 34 (refer to FIG. 2) in the X-axis direction and the Y-axis direction at a resolution of, for example, 10 nm or less, on the basis of the output of, e.g., the four X linear encoders 94x and the four Y linear encoders 94y, and the output of, e.g., the four X linear encoders 96x, and the four Y linear encoders 96y (that is, the position information of each of the pair of head units 60 in the XY plane), as shown in FIG. 8. Main controller 90 also acquires θZ position information (rotation quantity information) of substrate holder 34, on the basis of at least two outputs of, e.g., four X linear encoders 94x (or, e.g., four Y linear encoders 94y). Main controller 90 controls the position of substrate holder 34 within the XY plane using substrate driving system 93, on the basis of position information of substrate holder 34 within the XY plane acquired from the measurement values of the above substrate encoder system 50.

Substrate holder 34, as described above, also has scales 52, e.g., five, which are placed at a predetermined spacing in the X-axis direction in each of the areas at the +Y side and the −Y side of substrate P, as is shown in FIG. 4A. Also, of the above, e.g. five scales 52, placed in the X-axis direction at a predetermined spacing, substrate holder 34 is driven in the X-axis direction between a position where head unit 60 (all of the pair of X heads 66x and the pair of Y heads 66y (each refer to FIG. 4B)) faces scale 52 located outermost to the +X side, and a position where head unit 60 faces scale 52 located outermost to the −X side.

Similarly to the above mask encoder system 48, the spacing between each head of the pair of X heads 66x and each head of the pair of Y heads 66y that one head unit 60 has is set wider than the spacing between the adjacent scales 52, as shown in FIG. 4B. This allows at least one head of the pair of X heads 66x to constantly face X scale 53x and at least one head of the pair of Y heads 66y to constantly face Y scale 53y, in substrate encoder system 50. Substrate encoder system 50, therefore, is able to acquire position information of substrate holder 34 (refer to FIG. 4A) without interrupting the measurement values.

Referring back to FIG. 6, a dust-proof cover 55 consists of a member extending in the Y-axis direction which has a XZ section formed in a U-shape, and the second section 54b of encoder base 54 and Y slide table 62 are inserted, via a predetermined clearance, in between a pair of opposing surfaces. At the lower surface of dust-proof cover 55, openings are formed through which X heads 66x and Y heads 66y pass. This suppresses adhesion of dust generated from parts such as Y linear guide device 63 and belt 68c on scales 52. Also, a pair of dust-proof plates 55a (not shown in FIG. 5) is fixed to the lower surface of encoder base 54. Scales 56 are placed between the pair of dust-proof plates 55a, which suppress adhesion of dust generated from parts such as Y linear guide device 63 on scales 56.

FIG. 8 is a block diagram showing an input/output relation of main controller 90, which mainly structures a control system of liquid crystal exposure apparatus 10 (refer to FIG. 1) and has overall control over each section. Main controller 90, which includes a work station (or a microcomputer) or the like, has overall control over each section of liquid crystal exposure apparatus 10.

In liquid crystal exposure apparatus 10 (refer to FIG. 1) having the structure described above, under the control of main controller 90 (refer to FIG. 8), a mask loader not shown performs loading of mask M onto mask stage apparatus 14, and a substrate loader not shown performs loading of substrate P onto substrate stage apparatus 20 (substrate holder 34). Main controller 90 then executes alignment measurement using an alignment detection system not shown, and then, when the alignment measurement has been completed, sequentially performs an exposure operation of a step-and-scan method on a plurality of shot areas set on substrate P.

Next, an example of an operation of mask stage apparatus 14 and substrate stage apparatus 20 at the time of exposure operation will be described, using FIGS. 9A to 16B. Note that, in the description below, although the case of setting four shot areas on one substrate P (the case of setting four pieces) will be described, the number and placement of the shot areas set on one substrate P can be appropriately changed.

Figure 9A:
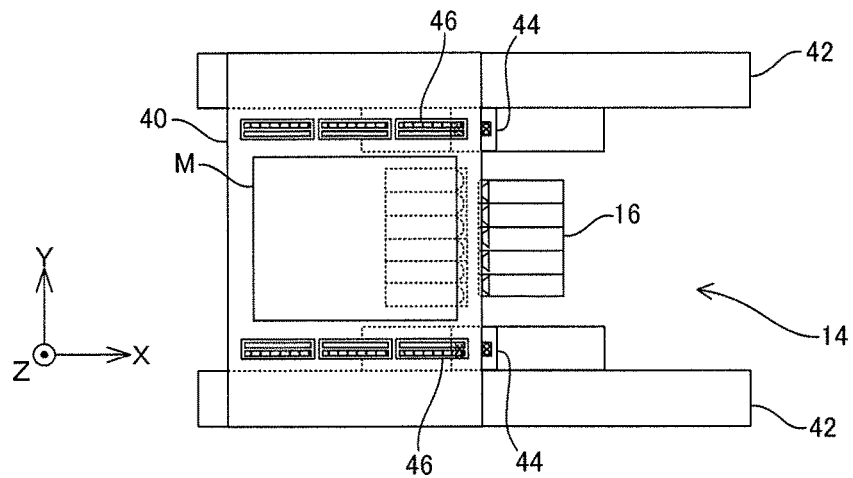
FIG. 9A is a view (No. 1) showing an operation of the mask encoder system at the time of exposure operation.
Figure 9B:
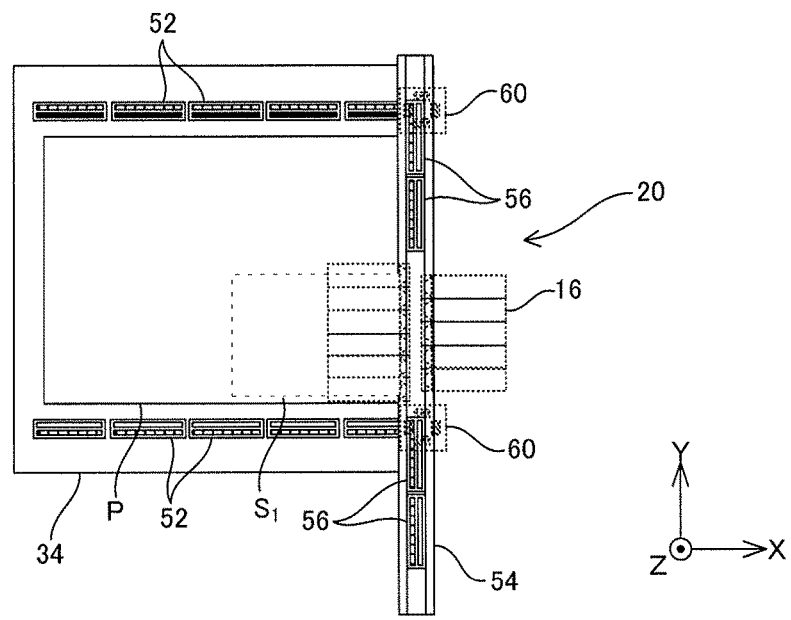
FIG. 9B is a view (No. 2) showing an operation of the substrate encoder system at the time of exposure operation.

FIG. 9A shows mask stage apparatus 14 which has completed alignment operation, and FIG. 9B shows substrate stage apparatus 20 (members other than substrate holder 34 are not shown. The same applies to the description below) which has completed alignment operation. Exposure processing, as an example, is performed from a first shot area $S_1$ which is set at the −Y side and also the +X side of substrate P, as shown in FIG. 9B. In mask stage apparatus 14, positioning of mask M is performed on the basis of the output of mask encoder system 48 (refer to FIG. 8), so that the edge at the +X side of mask M is positioned slightly to the −X side than the illumination area (in the state shown in FIG. 9A, however, illumination light IL is not irradiated yet on mask M) of illumination light IL irradiated from illumination system 12 (refer to FIG. 1 for each section), as shown in FIG. 9A. To be more specific, for example, the edge at the +X side of mask M is placed to the −X side with respect to the illumination area, only by an entrance length necessary to perform scanning exposure at a predetermined speed (that is, acceleration distance necessary to reach the predetermined speed), and at the position, scales 46 are arranged so that the position of mask M can be measured with mask encoder system 48. Also, in substrate stage apparatus 20, positioning of substrate P is performed on the basis of the output of substrate encoder system 50 (refer to FIG. 8), so that the edge at the +X side of the first shot area $S_1$ is positioned slightly to the −X side than the exposure area (in the state shown in FIG. 9B, however, illumination light IL is not irradiated yet on substrate P) on which illumination light IL (refer to FIG. 1) from projection optical system 16 is irradiated, as shown in FIG. 9B. To be more specific, for example, the edge at the +X side of the first shot area $S_1$ of substrate P is placed to the −X side with respect to the exposure area, only by an entrance length necessary to perform scanning exposure at a predetermined speed (that is, acceleration distance necessary to reach the predetermined speed), and at the position, scales 52 are arranged so that the position of substrate P can be measured with substrate encoder system 50. Note that, also when scanning exposure of the shot areas has been completed and mask M and substrate P are decelerated, scales 46 and 52 are arranged similarly so that mask encoder system 48 and substrate encoder system 50 can measure the position of mask M and substrate P, respectively, until mask M and substrate P have finished moving further by a deceleration distance necessary for deceleration to a predetermined speed from the speed at the time of scanning exposure. Alternatively, the position of mask M and substrate P may each be measured by measurement systems different from mask encoder system. 48 and substrate encoder system 50, during at least one of the operations of acceleration and deceleration.

Figure 10A:
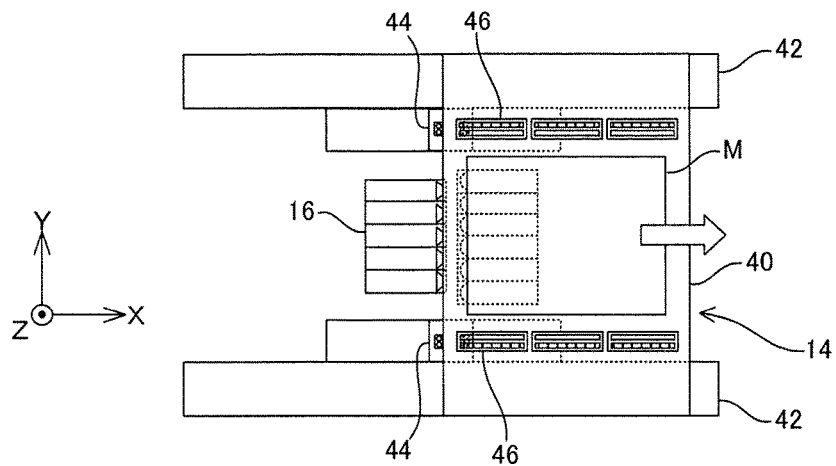
FIG. 10A is a view (No. 2) showing an operation of the mask encoder system at the time of exposure operation.
Figure 10B:
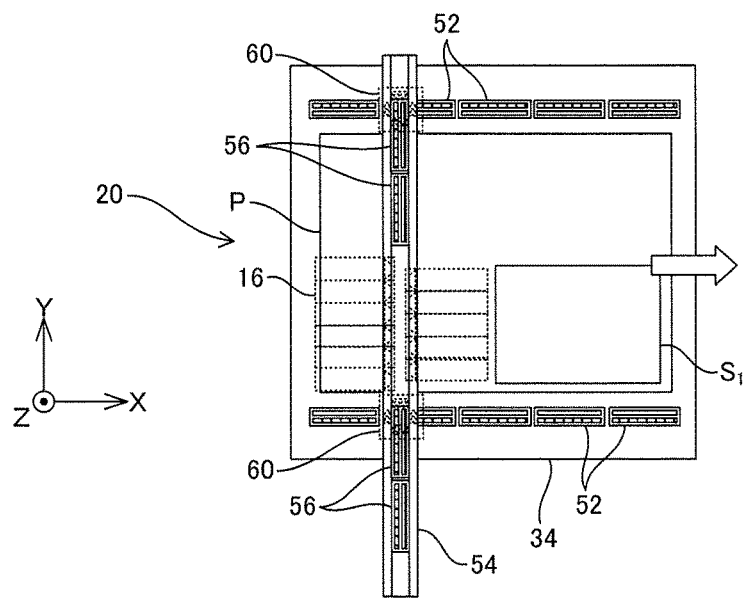
FIG. 10B is a view (No. 2) showing an operation of the substrate encoder system at the time of exposure operation.

Next, mask holder 40 is driven in the +X direction (acceleration, constant speed drive, and deceleration) as shown in FIG. 10A, and synchronously with mask holder 40, substrate holder 34 is driven in the +X direction (acceleration, constant speed drive, and deceleration) as shown in FIG. 10B. When mask holder 40 is driven, main controller 90 (refer to FIG. 8) performs position control of mask M on the basis of the output of mask encoder system 48 (refer to FIG. 8) as well as perform position control of substrate P on the basis of the output of substrate encoder system 50 (refer to FIG. 8). When substrate holder 34 is driven in the X-axis direction, the pair of head units 60 is to be in a stationary state. While mask holder 40 and substrate holder 34 are driven at a constant speed in the X-axis direction, illumination light IL (refer to FIG. 1 for each part) that has passed through mask M and projection optical system 16 is irradiated on substrate P, and by this operation, the mask pattern that mask M has is transferred onto shot area $S_1$.

Figure 11A:
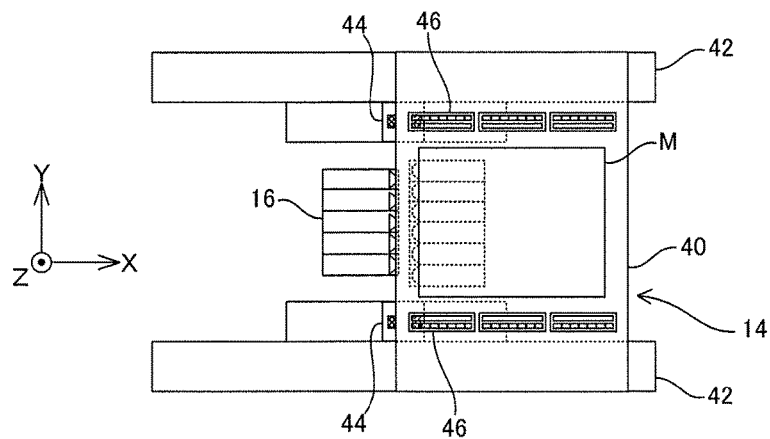
FIG. 11A is a view (No. 3) showing an operation of the mask encoder system at the time of exposure operation.
Figure 11B:
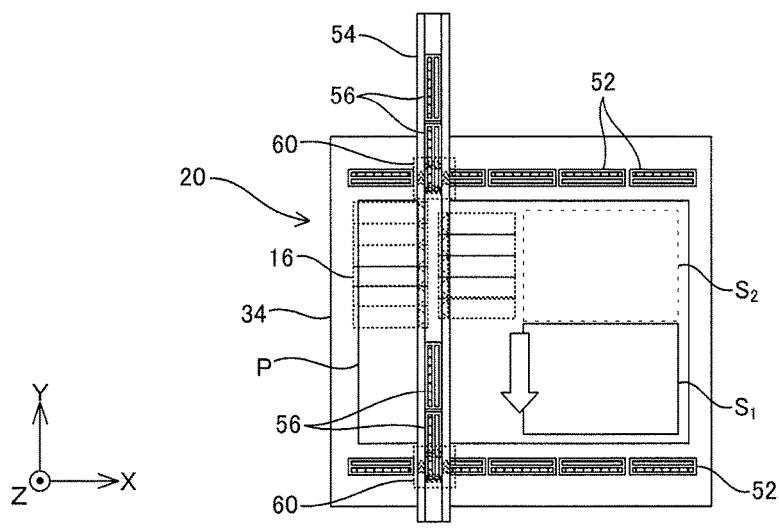
FIG. 11B is a view (No. 3) showing an operation of the substrate encoder system at the time of exposure operation.

When transfer of the mask pattern to the first shot area on substrate P is completed, in substrate stage apparatus 20, substrate holder 34 is driven (Y stepped) on the basis of the output of substrate encoder system 50 (refer to FIG. 8) in the −Y direction by a predetermined distance (a distance almost half of the dimension in the width direction of substrate P), for exposure operation of a second shot area $S_2$ set at the +Y side of the first shot area $S_1$, as shown in FIG. 11B. In the above Y step operation of substrate holder 34, mask holder 40 is stationary in a state where the edge of mask M at the −X side is positioned slightly to the +X side than the illumination area (in the state shown in FIG. 11A, however, mask M is not illuminated), as shown in FIG. 11A.

In the above Y step operation of substrate holder 34, as shown in FIG. 11B, at substrate stage apparatus 20, the pair of head units 60 is driven in the Y-axis direction synchronously with substrate holder 34. That is, main controller 90 (refer to FIG. 8) drives the pair of head units 60 in the Y-axis direction via the corresponding belt driving device 68 (refer to FIG. 8), on the basis of the output of Y linear encoders 96y (refer to FIG. 8) of substrate encoder system 50 (refer to FIG. 8), while driving substrate holder 34 in the Y-axis direction to a target position via substrate driving system 93 (refer to FIG. 8), on the basis of the output of Y linear encoders 94y. On this operation, main controller 90 drives the pair of head units 60 synchronously with substrate holder 34 (so that the pair of head units 60 follows substrate holder 34). Accordingly, each measurement beam irradiated from X heads 66x and Y heads 66y (refer to FIG. 7 for each head) does not move away from X scales 53x and Y scales 53y (refer to FIG. 7 for each scale), regardless of the Y position of substrate holder 34 (including when substrate holder 34 is moving). In other words, the pair of head units 60 should move synchronously with substrate holder 34 in the Y-axis direction, at a degree in which each of the measurement beams irradiated from X heads 66x and Y heads 66y while substrate holder 34 is moved in the Y-axis direction (during the Y step operation) do not move away from X scales 53x and Y scales 53y, that is, at a degree in which measurement by the measurement beams from X heads 66x and Y heads 66y is not interrupted (measurement can be continued).

Figure 12A:
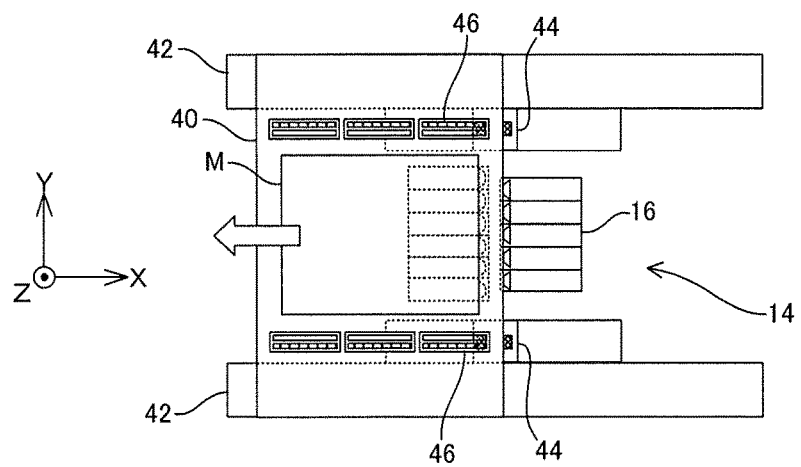
FIG. 12A is a view (No. 4) showing an operation of the mask encoder system at the time of exposure operation.
Figure 12B:
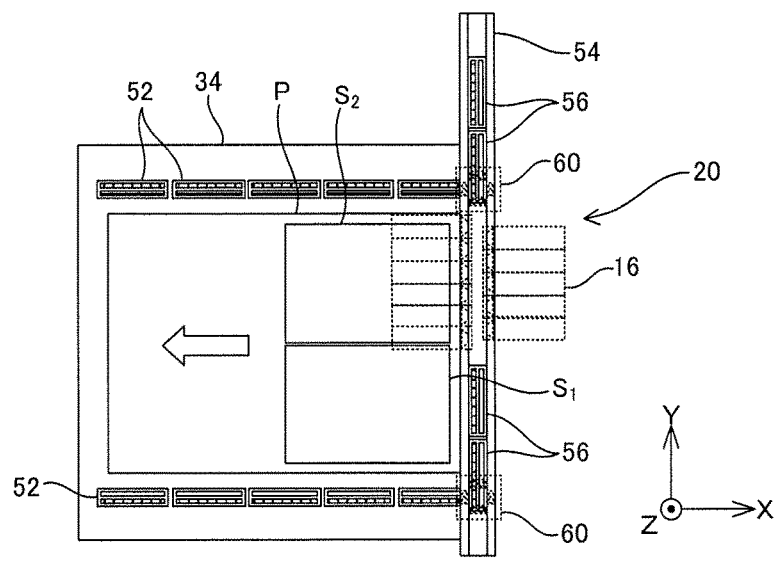
FIG. 12B is a view (No. 4) showing an operation of the substrate encoder system at the time of exposure operation.

When the Y step operation of substrate holder 34 is completed, as shown in FIG. 12A, mask holder 40 is driven in the −X direction on the basis of the output of mask encoder system 48 (refer to FIG. 8), and synchronously with mask holder 40, as shown in FIG. 12B, substrate holder 34 is driven in the −X direction on the basis of the output of substrate encoder system 50 (refer to FIG. 8). This allows the mask pattern to be transferred onto the second shot area $S_2$. The pair of head units 60 is to be in a stationary state also on this operation.

Figure 13A:
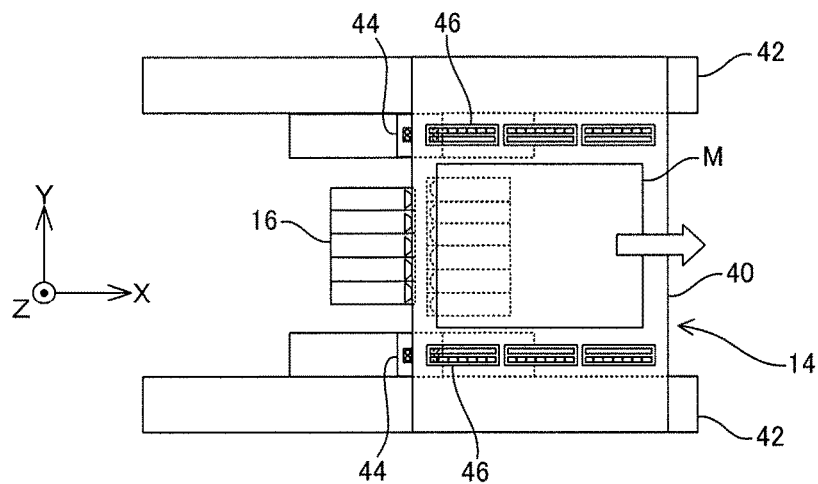
FIG. 13A is a view (No. 5) showing an operation of the mask encoder system at the time of exposure operation.
Figure 13B:
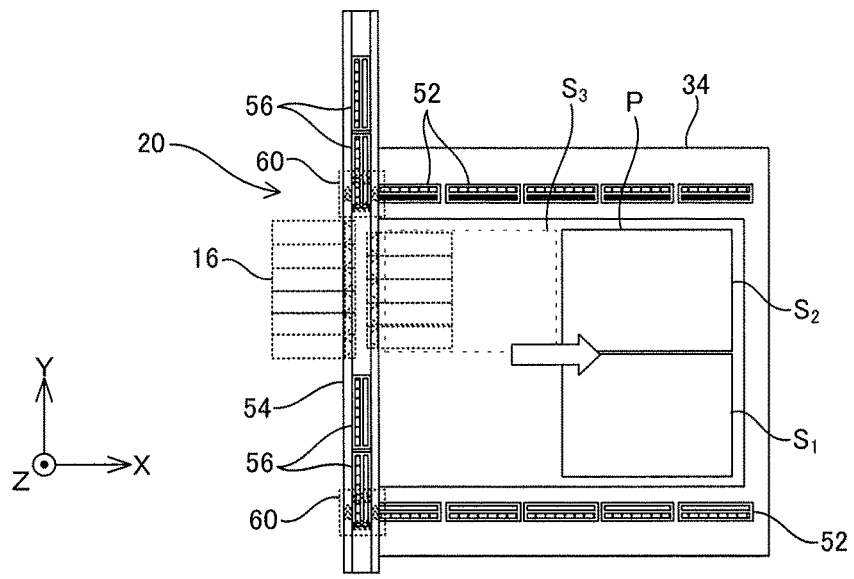
FIG. 13B is a view (No. 5) showing an operation of the substrate encoder system at the time of exposure operation.

When the exposure operation on the second shot area $S_2$ is completed, in mask stage apparatus 14, positioning of mask M is performed on the basis of the output of mask encoder system 48 (refer to FIG. 8), so that mask holder 40 is driven in the +X direction and the edge at the −X side of mask M is positioned slightly to the +X side than the illumination area, as shown in FIG. 13A. Also, in substrate stage apparatus 20, positioning of substrate P is performed on the basis of the output of substrate encoder system 50 (refer to FIG. 8), so that substrate holder 34 is driven in the +X direction and the edge at the −X side of a third shot area $S_3$ is positioned slightly to the +X side than the exposure area, for exposure operation of the third shot area $S_3$ set at the −X side of the second shot area $S_2$ as shown in FIG. 13B. At the time of moving operations shown in FIGS. 13A and 13B of mask holder 40 and substrate holder 34, illumination light IL is not irradiated with respect to mask M (refer to FIG. 13A) and substrate P (refer to FIG. 13B) from illumination system 12 (refer to FIG. 1). That is, the moving operations shown in FIGS. 13A and 13B of mask holder 40 and substrate holder 34 are simply positioning operations (X step operations) of mask M and substrate P.

Figure 14A:
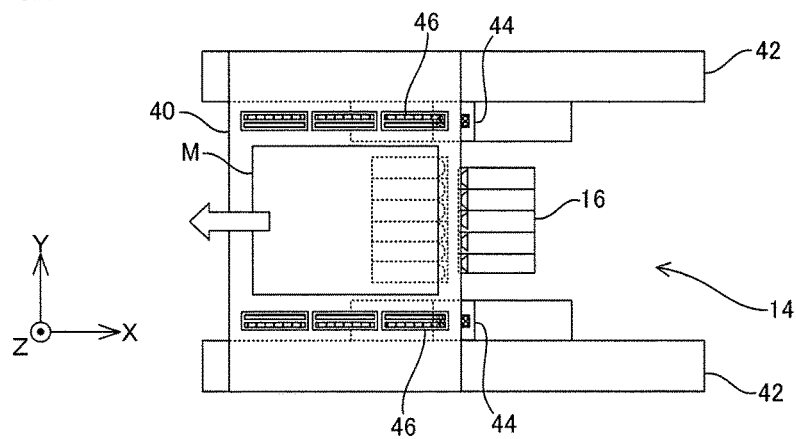
FIG. 14A is a view (No. 6) showing an operation of the mask encoder system at the time of exposure operation.
Figure 14B:
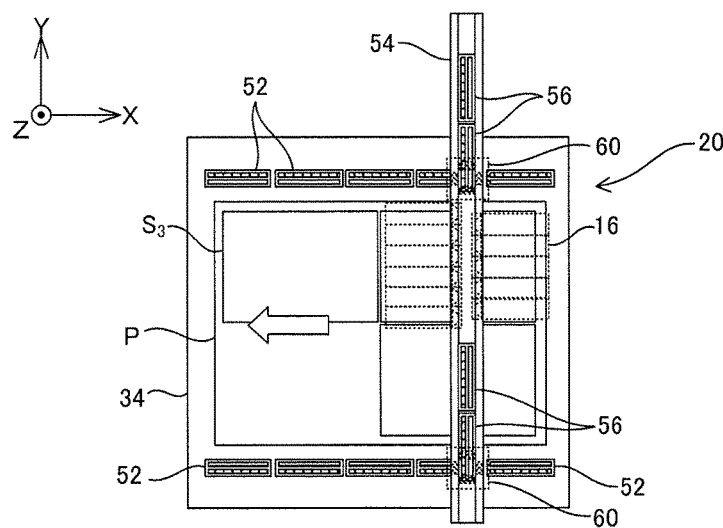
FIG. 14B is a view (No. 6) showing an operation of the substrate encoder system at the time of exposure operation.

When the X step operations of mask M and substrate P are completed, in mask stage apparatus 14, as shown in FIG. 14A, mask holder 40 is driven in the −X direction on the basis of the output of mask encoder system 48 (refer to FIG. 48). And, synchronously with mask holder 40, as shown in FIG. 14B, substrate holder 34 is driven in the −X direction on the basis of the output of substrate encoder system 50 (refer to FIG. 8). This allows the mask pattern to be transferred onto the third shot area $S_3$. The pair of head units 60 is to be in a stationary state also on this operation.

Figure 15A:
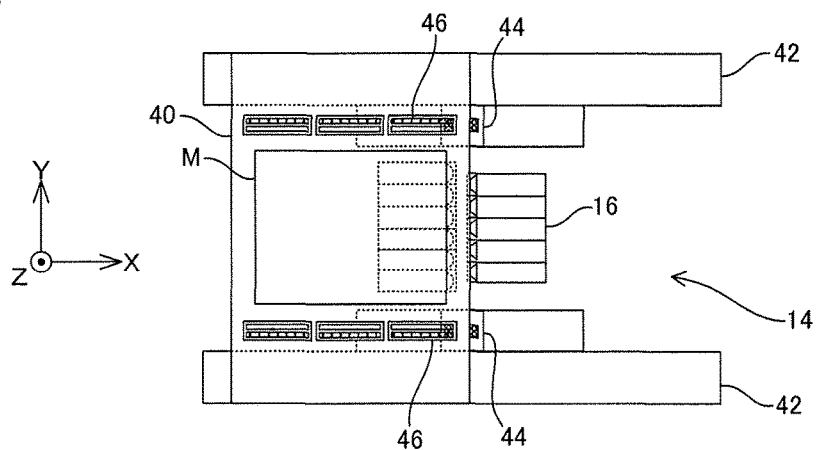
FIG. 15A is a view (No. 7) showing an operation of the mask encoder system at the time of exposure operation.
Figure 15B:
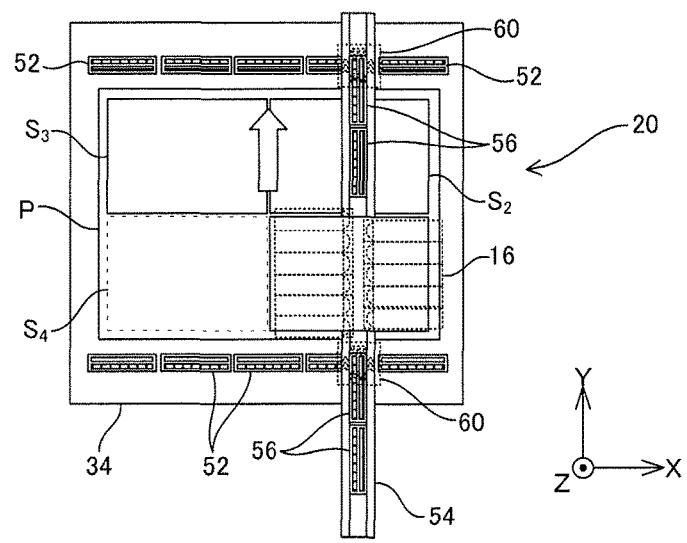
FIG. 15B is a view (No. 7) showing an operation of the substrate encoder system at the time of exposure operation.

When the exposure operation to the third shot area $S_3$ is completed, in substrate stage apparatus 20, substrate holder 34 is driven (Y step drive) in the +Y direction by a predetermined distance for exposure operation of a fourth shot area $S_4$ set at the −Y side of the third shot area $S_3$, as shown in FIG. 15B. On this operation, like the time of the Y step operation of substrate holder 34 shown in FIG. 11B, mask holder 40 is to be in a stationary state (refer to FIG. 15A). The pair of head units 60 is also driven in the +Y direction synchronously with substrate holder 34 (so as to follow substrate holder 34).

Figure 16A:
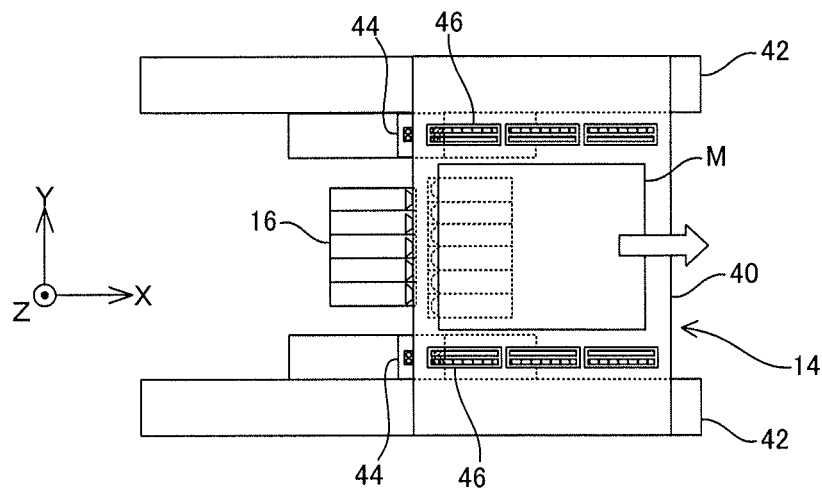
FIG. 16A is a view (No. 8) showing an operation of the mask encoder system at the time of exposure operation.
Figure 16B:
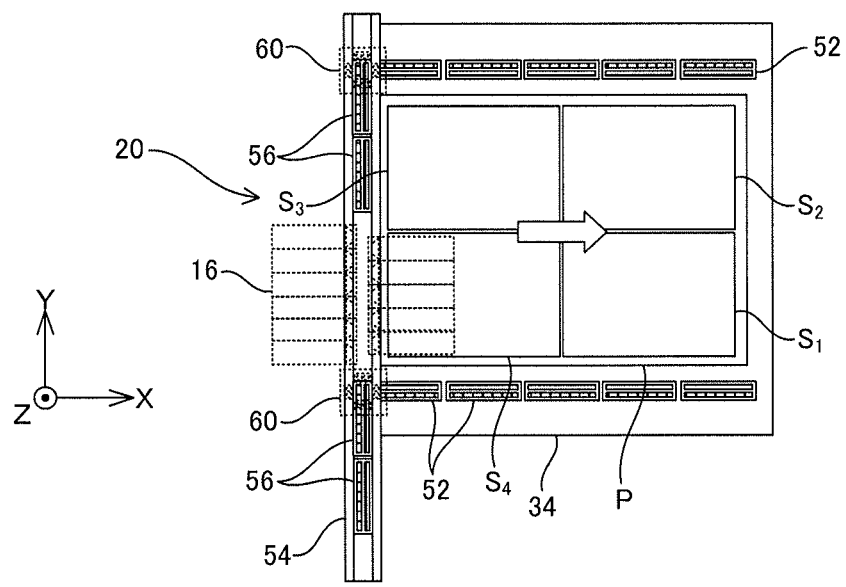
FIG. 16B is a view (No. 8) showing an operation of the substrate encoder system at the time of exposure operation.

When the Y step operation of substrate holder 34 is completed, mask holder 40 is driven in the +X direction on the basis of the output of mask encoder system 48 (refer to FIG. 8) as shown in FIG. 16A. And, synchronously with mask holder 40, substrate holder 34 is driven in the +X direction on the basis of the output of substrate encoder system 50 (refer to FIG. 8) as shown in FIG. 16B. This allows the mask pattern to be transferred onto the fourth shot area $S_4$. The pair of head units 60 is to be in a stationary state also on this operation.

As described so far, with liquid crystal exposure apparatus 10 according to the present embodiment, because mask encoder system 48 for acquiring the position information of mask M within the XY plane and substrate encoder system 50 for acquiring the position information of substrate P within the XY plane (refer to FIG. 1 for each system) each have short optical path lengths of the measurement beams irradiated on the corresponding scales, the influence of air fluctuation can be reduced when compared to, e.g., the conventional interferometer system. The positioning accuracy of mask M and substrate P, therefore, improves. Also, since the influence of air fluctuation is small, partial air-conditioning unit which is indispensable when using a conventional interferometer system can be omitted, which allows cost reduction.

Furthermore, in the case of using the interferometer system, large and heavy bar mirrors had to be equipped in mask stage apparatus 14 and substrate stage apparatus 20; however, with mask encoder system 48 and substrate encoder system 50 according to the present embodiment, the above bar mirrors will not be necessary. This allows each of the systems including mask holder 40 and the substrate holder 34 to be more compact and light as well as to have their weight balance improved, which improves position controllability of mask M and substrate P. Also, less places need to be adjusted when compared to the case of using the interferometer system, which allows cost reduction of mask stage apparatus 14 and substrate stage apparatus 14, and furthermore improves maintainability. Adjustment at the time of assembly also becomes easy (or unnecessary).

Also, in substrate encoder system 50 according to the present embodiment, since the system employs the structure of measuring the Y position information of substrate P by synchronously driving the pair of head units 60 (making the heads follow) in the Y-axis direction with substrate P, there is no need to place a scale extending in the Y-axis direction at the substrate stage apparatus 20 side (or no need to arrange a plurality of heads in the Y-axis direction at the apparatus main section 18 side). This simplifies the structure of the substrate Position measurement system, which allows cost reduction.

Also, in mask encoder system 48 according to the present embodiment, since the system employs the structure of acquiring the position information of mask holder 40 in the XY plane while appropriately switching the output of the pair of adjacent encoder heads (X head 49x, Y head 49y)

according to the X position of mask holder 40, the position information of mask holder 40 can be acquired without interruption, even if a plurality of scales 46 are arranged at a predetermined spacing (spaced apart from one another) in the X-axis direction. Accordingly, there is no need to prepare a scale having a length equal to the moving strokes of mask holder 40 (a length around three times of scale 46 of the present embodiment) in the system, which allows cost reduction, and makes it suitable especially for liquid crystal exposure apparatus 10 that uses a large mask M as in the present embodiment. Also similarly, in substrate encoder system 50 according to the present embodiment, since a plurality of scales 52 are placed in the X-axis direction and a plurality of scales 56 are placed in the Y-axis direction each at a predetermined spacing, scales having a length equal to the moving strokes of substrate P do not have to be prepared, which makes it suitable for application in liquid crystal exposure apparatus 10 which uses a large substrate P.

Second Embodiment

Next, a second embodiment will be described, referring to FIG. 17. Since the structure of the second embodiment is the same as the above first embodiment, except for the structure of a part of a mask encoder system 148, only the difference will be described below, and components having the same structure and function as the above first embodiment will have the same reference signs as the above first embodiment, and the descriptions thereabout will be omitted.

Figure 17:
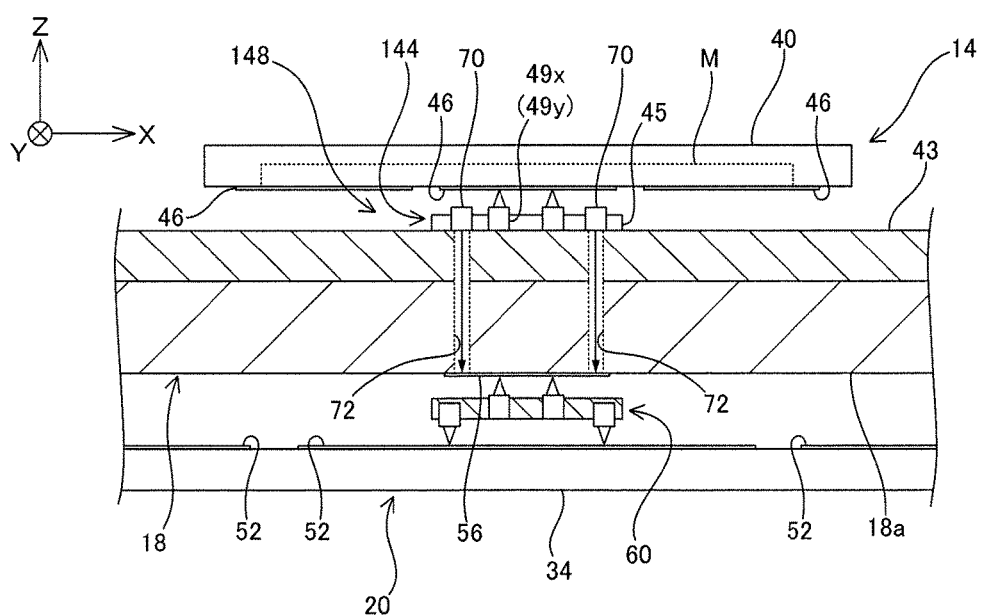
FIG. 17 A partially enlarged view of a mask encoder system according to a second embodiment.

As shown in FIG. 17, in mask encoder system 148 of the second embodiment, a plurality of sensors 70 is fixed to unit base 45 of head unit 144. Main controller 90 (not shown in FIG. 17, refer to FIG. 8) detects marks not shown formed on scales 56 fixed to upper mount section 18a of apparatus main section 18 (or grid lines formed on scales 56) using the plurality of sensors 70, via through holes 72 which penetrate encoder base 43 and upper mount section 18a, so as to acquire information on displacement quantity of Y heads 49y and X heads 49x in a direction parallel to the XY plane with respect to scales 56 (namely, apparatus main section 18). Main controller 90 performs position control of mask holder 40, while correcting the measurement values (output of Y head 49y and output of X head 49x) of mask encoder system 148, using the above information on displacement quantity (output of sensor 70). The type of sensor of sensor 70 is not limited in particular, and an image sensor similar to, for example, an aerial image measurement sensor can be used.

According to the second embodiment, scales 56 serving as a reference for position control of substrate holder 34, also function as a reference for position control of mask holder 40. That is, mask encoder system 148 and substrate encoder system 50 can be a single system (closed system), therefore, compared to the case when other members (e.g., projection optical system 16 (refer to FIG. 1)) serve as the reference for position control of mask holder 40, the system is free from the influence of the change of posture of other members. Accordingly, this improves the positioning accuracy of mask M and substrate P.

Third Embodiment

Next, a third embodiment will be described, referring to FIG. 18. Since the structure of the third embodiment is the same as the above first embodiment, except for the structure of a part of a substrate encoder system 150, only the difference will be described below, and components having the same structure and function as the above first embodiment will have the same reference signs as the above first embodiment, and the descriptions thereabout will be omitted.

Figure 18:
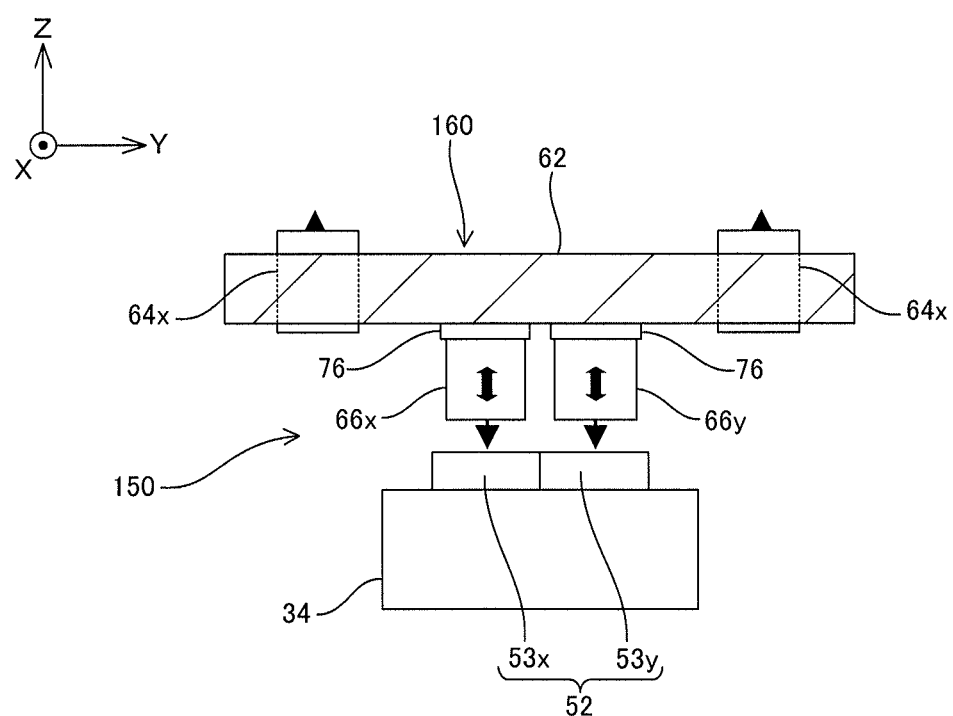
FIG. 18 A partially enlarged view of a substrate encoder system according to a third embodiment.

As shown in FIG. 18, in head units 160 that substrate encoder system 150 of the third embodiment has, X heads 66x and Y heads 66y are each attached to Y slide table 62 movable with fine strokes in the Z-axis direction via Z actuators 76. The type of Z actuator 76 is not limited in particular, and for example, parts such as a cam device, a piezoelectric element, a linear motor can be used. In substrate encoder system 150, a Z sensor which is not shown constantly measures the distance between each of the X heads 66x, Y heads 66y and the surface of scales 52 that substrate stage apparatus 20 has.

It is known that in the linear encoder system using an encoder head of a diffraction interference method as in the present embodiment, errors occur in the output of the encoder head due to a change in Z position of the scale surface (in the case of the present embodiment, X heads 66x and Y heads 66y each have sensitivity in the Z-axis direction, according to the Z position of substrate holder 34) (refer to, for example, U.S. Patent Application Publication No. 2008/0094592). Therefore, main controller 90 (not shown in FIG. 18, refer to FIG. 8) finely drives each of a plurality of X heads 66x and Y heads 66y appropriately in the Z-axis direction, on the basis of the output of the above Z sensor, so as to suppress the above errors that occur due to the change in Z position of the scale. Accordingly, this improves the positioning accuracy of substrate P. As the Z sensor, for example, a Z sensor of an optical pick-up method used in devices such as a CD drive may be used, or the position information in the Z-axis direction may be acquired along with the position information of substrate holder 34 in the X-axis direction (or Y-axis direction) with one encoder head, by using, for example, X heads 66x (or Y heads 66y) and a two-dimensional encoder as is disclosed in U.S. Pat. No. 7,561,280.

Note that, the structures of the first to third embodiments described so far can be appropriately changed. For example, in the above mask encoder system 48 and substrate encoder system 50 of the first embodiment, the arrangement of the encoder heads and the scales may be reversed. That is, for example, X linear encoders 92x and Y linear encoders 92y for acquiring position information of mask holder 40 may have the structure in which the encoder heads are attached to mask holder 40 and the scales are attached to encoder base 43. Also, X linear encoders 94x and Y linear encoders 94y used for acquiring position information of substrate holder 34 may have the structure in which the encoder heads are attached to substrate holder 34 and the scales are attached to Y slide table 62. In this case, it is favorable for the encoder heads attached to substrate holder 34 to have the structure, for example, of a plurality of encoder heads placed along the X-axis direction that can perform switching operation mutually. Similarly, X linear encoders 96x and Y linear encoders 96y for acquiring position information of Y slide table 62 may have the structure in which the scales are attached to Y slide table 62 and the encoder heads attached to encoder base 54 (apparatus main section 18). In this case, it is favorable for the encoder heads attached to encoder base 54 to have the structure, for example, of a plurality of encoder heads placed along the Y-axis direction that can perform switching operation mutually. In the case the encoder heads are fixed to substrate holder 34 and encoder base 54, the scales fixed to Y slide table 62 may be shared.

Also in substrate encoder system 50, while the case has been described where a plurality of scales 52 extending in the X-axis direction are fixed to the substrate stage apparatus 20 side and a plurality of scales 56 extending in the Y-axis direction are fixed to the apparatus main section 18 side (encoder base 54) side, the arrangement is not limited, and a plurality of scales extending in the Y-axis direction may be fixed to the substrate stage apparatus 20 side and a plurality of scales extending in the X-axis direction may be fixed to the apparatus main section 18 side. In this case, head units 60 are driven in the X-axis direction synchronously with substrate holder 34 at the time of exposure operation of substrate P.

Also, while the case has been described where in mask encoder system 48, for example, three scales 46 are placed apart in the X-axis direction, and in substrate encoder system 50, for example, two scales 52 are placed apart in the Y-axis direction, and for example, five scales 56 are placed apart in the X-axis direction, the number of scales is not limited to this. For example, the number of scales can be appropriately changed according to the size of mask M, substrate P, or the moving strokes. Also, the plurality of scales do not necessarily have to be placed spaced apart, and for example, a longer single scale may be used (in the case of the above embodiments, for example, a scale having a length around three times as that of scale 46, a scale having a length around two times as that of scale 52, and a scale having a length around five times as that of scale 56).

Also, while the case has been described where X scales and Y scales are formed independently on the surface of each of the scales 46, 52, and 56, the scales are not limited to this, and for example, XY two-dimensional scales may also be used. In this case, the encoder heads can also use the XY two-dimensional heads. Also, while the case has been described where the encoder system of a diffraction interference method is used, the system is not limited to this, and other encoders that employs a so-called pick-up method, or a magnetic encoder can be used, and for example, a so-called scan encoder like the one disclosed in, for example, U.S. Pat. No. 6,639,686 can also be used. Also, position information of Y slide table 62 may be acquired by a measurement system other than the encoder system (for example, an optical interferometer system).

Also, substrate stage apparatus 20 only has to drive at least substrate P along a horizontal plane in long strokes, and in some cases, does not have to perform fine positioning in directions of six degrees of freedom. The substrate encoder system according to the above first to third embodiments can suitably applied, even to such two-dimensional stage apparatus.

Also, the illumination light may be ultraviolet light such as an ArF excimer laser light (wavelength 193 nm), KrF excimer laser light (wavelength 248 nm), or vacuum-ultraviolet light such as an $F_2$ laser light (wavelength 157 nm). Also, as the illumination light, for example, a harmonic wave may be used, which is a single-wavelength laser beaming the infrared or visual region oscillated from a DFB semiconductor laser or a fiber laser amplified by an erbium-doped (or erbium-and-ytterbium doped) fiber amplifier, and then whose wavelength is converted into the ultraviolet light using a nonlinear crystal. Also, solid-state lasers (wavelength: 355 nm, 266 nm) may also be used.

Also, while the case has been described where projection optical system 16 is a projection optical system of a multiple lens method equipped with a plurality of optical systems, the number of projection optical systems is not limited to this, and one or more will be fine. Also, the projection optical system is not limited to the projection optical system of a multiple lens method, and may also be an Offner type projection optical system which uses a large mirror. Also, as projection optical system 16, a magnifying system or a reduction system may also be used.

Also, the exposure apparatus to which the embodiments are applied is not limited to the exposure apparatus for liquid crystals which transfers the liquid crystal display device pattern onto a square-shaped glass plate, and may also be widely applied, for example, to an exposure apparatus for manufacturing organic EL (Electro-Luminescence) panels, an exposure apparatus for manufacturing semiconductors, or to an exposure apparatus for manufacturing thin film magnetic heads, micromachines, and DNA chips. Also, the above embodiments can be applied not only to an exposure apparatus for manufacturing microdevices such as semiconductors, but also to an exposure apparatus that transfers a circuit pattern onto a glass substrate or a silicon wafer to manufacture a reticle or a mask used in an optical exposure apparatus, an EUV exposure apparatus, an X-ray exposure apparatus, and an electron-beam exposure apparatus.

Also, the object subject to exposure is not limited to a glass plate, and may also be other objects, such as, for example, a wafer, a ceramic substrate, a film member, or a mask blanks. Also, in the case the exposure object is a substrate for a flat panel display, the thickness of the substrate is not limited in particular, and includes, for example, a film-like substrate (a sheet-like member having flexibility). It is to be noted that the exposure apparatus of the present embodiment is especially effective in the case when the exposure object is a substrate whose length of aside or diagonal length is 500 mm or more.

Electronic devices such as liquid crystal display devices (or semiconductor devices) are manufactured through the steps such as; a step for performing function/performance design of a device, a step for making a mask (or a reticle) on the basis of this design step, a step for making a glass substrate (or a wafer), a lithography step for transferring a pattern of a mask (reticle) onto the glass substrate by the exposure apparatus and the exposure method described in each of the above embodiments, a development step for developing the glass substrate which has been exposed, an etching step for removing by etching an exposed member of an area other than the area where the resist remains, a resist removing step for removing the resist that is no longer necessary since etching has been completed, a device assembly step, and an inspection step. In this case, in the lithography step, because the device pattern is formed on the glass substrate by carrying out the exposure method previously described using the exposure apparatus of the above embodiments, this allows a highly integrated device to be manufactured with good productivity.

It is to be noted that all publications, international publications, U.S. patent application Publications, and U.S. patents quoted in the above embodiments related to the exposure apparatus and the like, in their entirety, are incorporated herein by reference.

INDUSTRIAL APPLICABILITY

As described above, the movable body apparatus and the movable body drive method of the present invention are suitable for driving a movable body along a predetermined two-dimensional plane. Also, the exposure apparatus of the present invention is suitable for forming a predetermined pattern on an object. Also, the manufacturing method of flat panel displays of the present invention is suitable for producing flat panel displays. Also, the device manufacturing method of the present invention is suitable for producing microdevices.

REFERENCE SIGNS LIST

10 . . . liquid crystal exposure apparatus,
14 . . . mask stage apparatus,
20 . . . substrate stage apparatus,
34 . . . substrate holder,
40 . . . mask holder,
44 . . . head unit,
46 . . . scale,
48 . . . mask encoder system,
50 . . . substrate encoder system,
52 . . . scale,
56 . . . scale,
60 . . . head unit,
90 . . . main controller,
M . . . mask,
P . . . substrate.

The invention claimed is:

1. An exposure apparatus that performs scanning exposure of an object by relatively driving the object with respect to an optical system, the apparatus comprising:
 a first movable body that holds the object and is movable in a first direction and a second direction intersecting each other;
 a reference member serving as a reference for movement of the first movable body in the first direction and the second direction;
 a second movable body disposed between the first movable body and the reference member, and movable in the second direction;
 a first measurement system that acquires position information of the first movable body in the first direction with respect to the reference member, with a first head disposed at one of the first movable body and the second movable body and a first scale disposed at the other of the first movable body and the second movable body that can measure a movement range of the first movable body in the first direction at the time of the scanning exposure; and
 a second measurement system that acquires position information of the first movable body in the second direction with respect to the reference member, with a second head disposed at one of the second movable body and the reference member and a second scale disposed at the other of the second movable body and the reference member that can measure a movement range of the first movable body in the second direction at the time of the scanning exposure.

2. The exposure apparatus according to claim 1, further comprising:
 a control system that controls a position of the first movable body with respect to the reference member, wherein
 the first measurement system acquires the position information by the first head measuring the first scale having a measurement component in the second direction,
 the second measurement system acquires the position information by the second head measuring the second scale having a measurement component in the first direction, and
 the control system controls the position of the first movable body with respect to the reference member, on the basis of the position information acquired by the first measurement system and the second measurement system.

3. The exposure apparatus according to claim 1, wherein the object is a substrate used in a flat panel display.

4. The exposure apparatus according to claim 3, wherein the substrate has at least one of a side length and a diagonal length that is 500 mm and over.

5. A manufacturing method of a flat panel display, comprising:
 exposing the object using the exposure apparatus according to claim 1; and
 developing the object which has been exposed.

6. A device manufacturing method, comprising:
 exposing the object using the exposure apparatus according to claim 1; and
 developing the object which has been exposed.

7. An exposure method in which scanning exposure of an object is performed by relatively scanning the object with respect to an optical system, the method comprising:
 acquiring position information of a first movable body, which holds the object and is movable in a first direction and a second direction intersecting each other, in the first direction with respect to a reference member, using a first measurement system having a first head disposed at one of a second movable body and the first movable body and a first scale disposed at the other of the second movable body and the first movable body that can measure a movement range of the first movable body in the first direction at the time of the scanning exposure, the second movable body being disposed between the first movable body and the reference member, and being movable in the second direction; and
 acquiring position information of the first movable body in the second direction with respect to the reference member, using a second measurement system, having a second head disposed at one of the second movable body and the reference member and a second scale disposed at the other of the second movable body and the reference member, that can measure a movement range of the first movable body in the second direction at the time of scanning exposure.

8. The exposure method according to claim 7, further comprising:
 controlling a position of the first movable body with respect to the reference member, wherein
 the first measurement system acquires the position information by the first head measuring the first scale having a measurement component in the second direction,
 the second measurement system acquires the position information by the second head measuring the second scale having a measurement component in the first direction, and
 the position of the first movable body with respect to the reference member is controlled, on the basis of position information acquired by the first measurement system and the second measurement system.

* * * * *